(12) United States Patent
Cha et al.

(10) Patent No.: US 11,436,079 B2
(45) Date of Patent: Sep. 6, 2022

(54) SEMICONDUCTOR MEMORY DEVICES HAVING ENHANCED ERROR CORRECTION CIRCUITS THEREIN

(71) Applicant: Samsung Electronics Co., Ltd., Suwon-si (KR)

(72) Inventors: Sanguhn Cha, Suwon-si (KR); Yesin Ryu, Seoul (KR)

(73) Assignee: Samsung Electronics Co., Ltd.

( * ) Notice: Subject to any disclaimer, the term of this patent is extended or adjusted under 35 U.S.C. 154(b) by 360 days.

(21) Appl. No.: 16/711,557

(22) Filed: Dec. 12, 2019

(65) Prior Publication Data

US 2020/0394102 A1  Dec. 17, 2020

(30) Foreign Application Priority Data

Jun. 12, 2019  (KR) .......................... 10-2019-0069150

(51) Int. Cl.
| | | |
|---|---|---|
| *H03M 13/00* | (2006.01) | |
| *G06F 11/10* | (2006.01) | |
| *H03M 13/29* | (2006.01) | |
| *H03M 13/15* | (2006.01) | |
| *H01L 25/065* | (2006.01) | |
| *H01L 25/16* | (2006.01) | |

(52) U.S. Cl.
CPC ...... *G06F 11/1068* (2013.01); *H01L 25/0657* (2013.01); *H01L 25/16* (2013.01); *H03M 13/1575* (2013.01); *H03M 13/2906* (2013.01); *H01L 2225/06513* (2013.01); *H01L 2225/06541* (2013.01)

(58) Field of Classification Search
CPC .. G06F 11/1068; H01L 25/0657; H01L 25/16; H01L 2225/06541; H01L 2225/06513; H03M 13/2906; H03M 13/1575
See application file for complete search history.

(56) References Cited

U.S. PATENT DOCUMENTS

| | | |
|---|---|---|
| 8,230,305 B2 | 7/2012 | Resnick |
| 9,817,714 B2 | 11/2017 | Halbert et al. |
| 10,108,512 B2 | 10/2018 | Halbert et al. |
| 10,140,176 B2 | 11/2018 | Cha et al. |
| 10,162,703 B2 | 12/2018 | Kim |
| 10,635,531 B2 * | 4/2020 | Cha ........................ G11C 29/72 |
| 2017/0371746 A1 * | 12/2017 | Kim ...................... G06F 3/0619 |
| 2019/0012229 A1 | 1/2019 | Cha et al. |

FOREIGN PATENT DOCUMENTS

JP  4213814  11/2000

* cited by examiner

*Primary Examiner* — Samir W Rizk
(74) *Attorney, Agent, or Firm* — Myers Bigel, P.A.

(57) ABSTRACT

An error correction circuit includes an error correction code (ECC) memory and an ECC engine. The ECC memory stores an ECC, which is at least partially represented by a generation matrix. The ECC engine generates parity data based on main data using the ECC, and detects and/or corrects at least one error bit in the main data read from the memory cell array using the parity data. The main data includes a plurality of data bits divided into a plurality of sub data units. The ECC includes a plurality of column vectors divided into a plurality of code groups corresponding to the sub data units. The column vectors have elements configured to gather a mis-corrected bit and multiple error bits in one symbol and the mis-corrected bit is generated due to the multiple error bits in the main data.

20 Claims, 22 Drawing Sheets

| CV11 ⊗ CV12 | CV13 | CV14 | CV15 | CV16 | CV17 | CV18 |
|---|---|---|---|---|---|---|
| 1 | 1 | 0 | 1 | 1 | 0 | 0 |
| 0 | 1 | 1 | 1 | 0 | 0 | 1 |
| 0 | 1 | 1 | 0 | 1 | 1 | 0 |
| 1 | 0 | 1 | 1 | 1 | 0 | 0 |
| 1 | 1 | 1 | 1 | 1 | 1 | 1 |
| 0 | 0 | 0 | 0 | 0 | 0 | 0 |
| 1 | 1 | 1 | 1 | 1 | 1 | 1 |
| 0 | 0 | 0 | 0 | 0 | 0 | 0 |
|  | =CV14 | =CV13 | =CV18 | =CV17 | =CV16 | =CV15 |

FIG. 13

ECC1b

| SDU21 | SDU22 | SDU23 | SDU24 |
|---|---|---|---|
| d0~d7 | d8~d15 | d16~d23 | d24~d31 |
| CG21 | CG22 | CG23 | CG24 |

| SDU25 | SDU26 | SDU27 | SDU28 |
|---|---|---|---|
| d32~d39 | d40~d47 | d48~d55 | d56~d63 |
| CG25 | CG26 | CG27 | CG28 |

| SDU29 | SDU210 | SDU211 | SDU212 |
|---|---|---|---|
| d64~d71 | d72~d79 | d80~d87 | d88~d95 |
| CG29 | CG210 | CG211 | CG212 |

SEMICONDUCTOR MEMORY DEVICES HAVING ENHANCED ERROR CORRECTION CIRCUITS THEREIN

REFERENCE TO RELATED APPLICATION

This application claims priority under 35 U.S.C. § 119 to Korean Patent Application No. 10-2019-0069150, filed Jun. 12, 2019, the disclosure of which is hereby incorporated herein by reference.

TECHNICAL FIELD

Exemplary embodiments of the present disclosure relate to memory devices and, more particularly, to semiconductor memory devices that support error detection and correction (EDC) and memory systems including the same.

DISCUSSION OF THE RELATED ART

Semiconductor memory devices may be classified as non-volatile memory devices, such as flash memory devices having non-volatile memory cells (e.g., EEPROM cells) therein, and volatile memory devices, such as dynamic random access memory (DRAM) devices and static random access memory (SRAM) devices. DRAM devices are often used for system memories (e.g., cache memories) due to their high speed operation, small size and cost efficiency. Nonetheless, due to the continuing reduction in fabrication design rules of DRAM devices, bit errors of memory cells in DRAM devices may increase, and the yield of DRAM devices having sufficiently error-free memory cells therein may decrease.

SUMMARY

Exemplary embodiments of the present disclosure provide an error correction circuit of a semiconductor memory device capable of improving performance and reliability, a semiconductor memory device including the same, and a memory system including the same.

According to exemplary embodiments of the present disclosure, an error correction circuit of a semiconductor memory device includes an error correction code (ECC) memory and an ECC engine. The ECC memory stores an ECC which is represented, at least in part, by a generation matrix. The ECC engine generates parity data based on main data using the ECC and then detects and/or corrects at least one error bit in the main data read from the memory cell array using the parity data. The main data includes a plurality of data bits divided into a plurality of sub data units, the ECC includes a plurality of column vectors divided into a plurality of code groups corresponding to the sub data units, the column vectors have elements configured to gather a mis-corrected bit and multiple error bits in one symbol, and the mis-corrected bit is generated due to the multiple error bits in the main data.

According to exemplary embodiments of the present disclosure, a semiconductor memory device includes a memory cell array including a plurality of bank arrays, an error correction circuit and a control logic circuit. Each of the plurality of bank arrays includes a normal cell region that stores main data, and a redundancy cell region that stores first parity data associated with the main data. In some of these embodiments, each of the plurality of bank arrays may include a plurality of dynamic memory cells coupled to word-lines and bit-lines. The error correction circuit is configured to generate the parity data based on the main data using an error correction code (ECC) represented by a generation matrix, and corrects at least one error bit in the main data using the parity data. The control logic circuit may control the error correction circuit based on a command and an address. The main data includes a plurality of data bits divided into a plurality of sub data units, the ECC includes a plurality of column vectors divided into a plurality of code groups corresponding to the sub data units, the column vectors have elements configured to gather a mis-corrected bit and multiple error bits in one symbol and the mis-corrected bit is generated due to the multiple error bits in the main data.

According to exemplary embodiments of the present disclosure, a memory system includes a semiconductor memory device and a memory controller configured to control the semiconductor memory device. The semiconductor memory device includes a memory cell array having a plurality of bank arrays therein, an error correction circuit and a control logic circuit. Each of the plurality of bank arrays includes a normal cell region that stores main data, and a redundancy cell region that stores first parity data associated with the main data and each of the plurality of bank arrays includes a plurality of dynamic memory cells coupled to word-lines and bit-lines. The error correction circuit generates the parity data based on the main data using an error correction code (ECC) represented by a generation matrix, and corrects at least one error bit in the main data using the parity data. The control logic circuit controls the error correction circuit based on a command and an address provided from the memory controller. The main data includes a plurality of data bits divided into a plurality of sub data units, the ECC includes a plurality of column vectors divided into a plurality of code groups corresponding to the sub data units, the column vectors have elements to gather a mis-corrected bit and multiple error bits in one symbol and the mis-corrected bit is generated due to the multiple error bits in the main data.

According to additional embodiments of the present disclosure, an ECC includes a plurality of column vectors corresponding to data bits, the column vectors are divided into a plurality of code groups, and have elements configured to gather a mis-corrected bit and multiple error bits in one symbol. In addition, the mis-corrected bit is generated due to the multiple error bits in the main data and the one symbol includes one or two sub data units. Therefore, when multiple error bits are present, which the error correction circuit is not capable of correcting and/or detecting, an error correction circuit of a memory controller may correct sub data unit including the multiple error bits and a m is-corrected bit because the multiple error bits and the mis-corrected are gathered in the same sub data unit.

BRIEF DESCRIPTION OF THE DRAWINGS

The above and other features of the present disclosure will become more apparent by describing in detail exemplary embodiments thereof with reference to the accompanying drawings.

FIGS. 11A and 11B illustrate the first through eighth code groups shown in FIG. 10.

FIG. 12 is a table illustrating a result of exclusive OR (XOR) operation of three column vectors in the first code group in FIG. 11A.

FIG. 13 illustrates another example of the first ECC according to exemplary embodiments of the present disclosure.

FIGS. 14A through 14C illustrate the $1^{st}$ through $12^{th}$ code groups in FIG. 13.

DETAILED DESCRIPTION OF THE EMBODIMENTS

Figure 1:
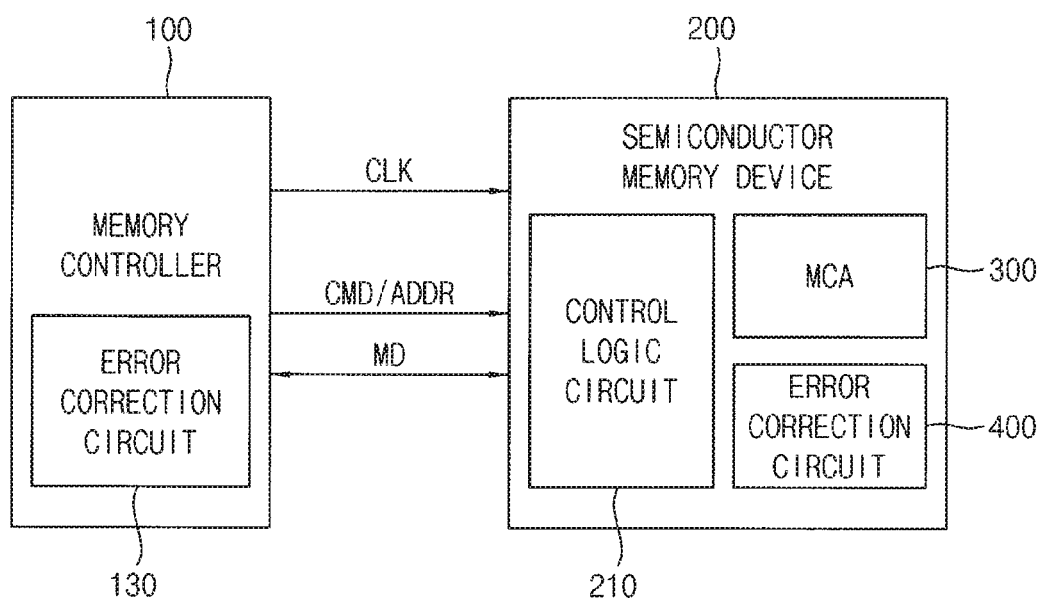
FIG. 1 is a block diagram illustrating a memory system, according to exemplary embodiments of the present disclosure.

Exemplary embodiments of the present disclosure will be described more fully hereinafter with reference to the accompanying drawings. Like reference numerals may refer to like elements throughout the accompanying drawings.

FIG. 1 is a block diagram illustrating a memory system according to exemplary embodiments of the present disclosure. Referring to FIG. 1, a memory system 20 may include a memory controller 100 (e.g., an external memory controller) and a semiconductor memory device 200. The memory controller 100 may control the overall operation of the memory system 20. The memory controller 100 may control the overall data exchange between an external host and the semiconductor memory device 200. For example, the memory controller 100 may write data in the semiconductor memory device 200 or read data from the semiconductor memory device 200 in response to request from the host. In addition, the memory controller 100 may issue operation commands to the semiconductor memory device 200 for controlling the semiconductor memory device 200.

In exemplary embodiments, a number of the data memories may be 8 or 16. However, the number of the data memories is not limited thereto. In exemplary embodiments, the semiconductor memory device 200 is a memory device including a plurality of dynamic memory cells such as a dynamic random access memory (DRAM), double data rate 4 (DDR4) synchronous DRAM (SDRAM) or a stacked memory device such as a high bandwidth memory (HBM).

The memory controller 100 transmits a clock signal CLK, a command CMD, and an address (signal) ADDR to the semiconductor memory device 200 and exchanges main data MD with the semiconductor memory device 200. The memory controller 100 may include an error correction circuit 130.

The error correction circuit 130 may generate system parity data to be transmitted to the semiconductor memory device 200 based on the main data MD, may store the system parity data, may generate check bits based on the main data MD received from the semiconductor memory device 200 and may correct at least one error bit in the main data MD by symbol basis based on a comparison of the system parity data and the check bits.

The semiconductor memory device 200 includes a memory cell array 300 that stores the main data MD, an error correction circuit 400 and a control logic circuit 210. The error correction circuit 400 may generate a parity data using an error correction code (ECC) which is represented by a generation matrix by performing an ECC encoding on the main data MD and may detect and/or correct at least one error bit in the main data MD read from the memory cell array 300 using the parity data by performing an ECC decoding on the main data MD.

The main data MD includes a plurality of data bits, and the plurality of data bits may be divided into a plurality of sub data units. The ECC may include a plurality of column vectors divided into a plurality of code groups corresponding to the sub data units and the column vectors may have elements to gather a mis-corrected bit and multiple error bits in one symbol, and the mis-corrected bit is generated due to the multiple error bits in the main data. Therefore, when the read main data includes multiple error bits which the error correction circuit 400 is not capable of correcting, the memory controller 100 may correct a sub data unit including the multiple error bits. The control logic circuit 210 may control the error correction circuit 400 to perform the ECC encoding and the ECC decoding.

The semiconductor memory device 200 may perform a burst operation. Herein, the burst operation refers to an operation of writing or reading a large amount of data by sequentially increasing or decreasing an initial address provided from the memory controller 100. A basic unit of the burst operation may be referred to a burst length BL. In exemplary embodiments, the burst length BL refers to the number of operations of continuously reading or writing data by sequentially increasing or decreasing an initial address.

Figure 2:
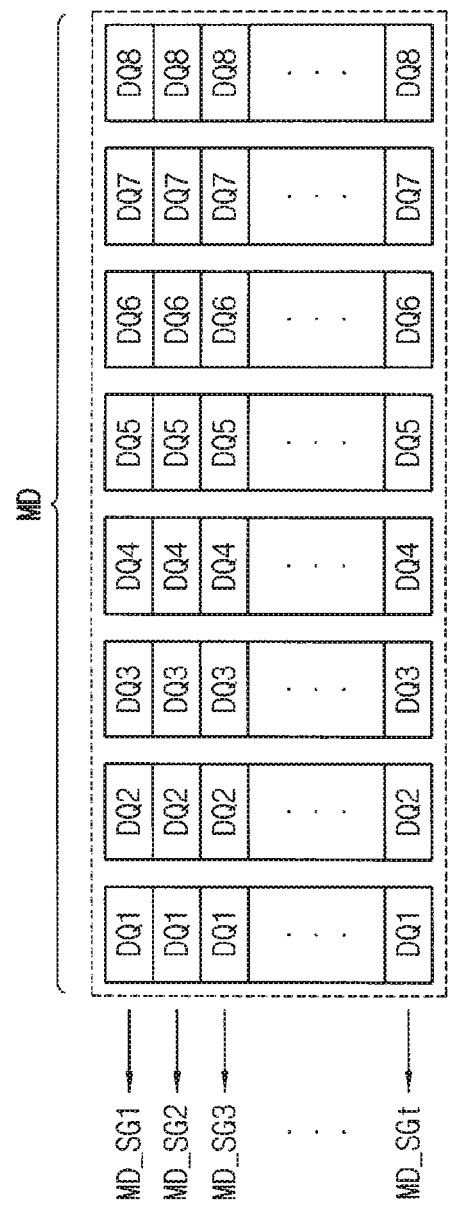
FIG. 2 illustrates a main data configuration corresponding to the plurality of burst lengths in the memory system of FIG. 1, according to exemplary embodiments.

FIG. 2 illustrates a main data corresponding to the plurality of burst lengths in the memory system of FIG. 1, according to exemplary embodiments. Referring to FIG. 2, the main data MD corresponding to the plurality of burst lengths are input to/output from the semiconductor memory device 200. The main data MD includes data segments MD_SG1-MD_SGt (t is a natural number equal to or greater than 8) each corresponding to each of the plurality of burst lengths. The burst length is assumed to be 8 in FIG. 2. However, exemplary embodiments of the present disclosure are not limited thereto. The main data MD corresponding to the plurality of burst lengths may be stored in the memory cell array 300 of the semiconductor memory device 200.

In exemplary embodiments, the burst length may be 8 or 12.

Figure 3:
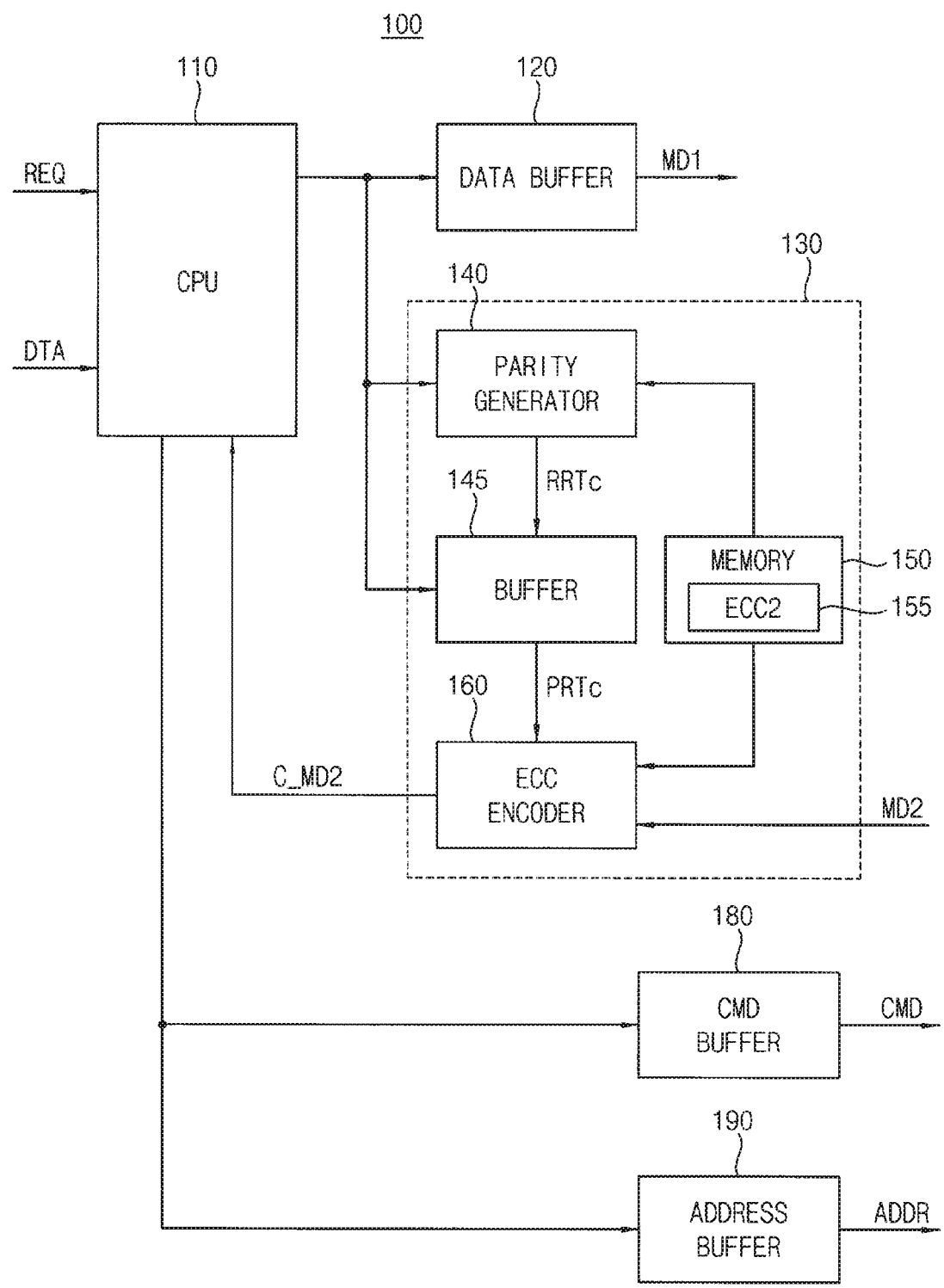
FIG. 3 is a block diagram illustrating an example of the memory controller in FIG. 1, according to exemplary embodiments of the present disclosure.

FIG. 3 is a block diagram illustrating an example of the memory controller in FIG. 1 according to exemplary embodiments of the present disclosure. Referring to FIG. 3, the memory controller 100 may include a central processing unit (CPU) 110, a data buffer 120, the error correction circuit 130, a command buffer 180 and an address buffer 190. The error correction circuit 130 may include a parity generator 140, a buffer 145, a memory 150 that stores a second ECC 155, and an ECC decoder 160. The CPU 110 receives a request REQ and data DTA from the host, and provides the data DTA to the data buffer 120 and the parity generator 140. The data buffer 120 buffers the data DTA to provide a first main data MD1 to the semiconductor memory device 200.

The parity generator 140 is coupled to the memory 150, performs an ECC encoding on the data DTA using the second ECC 155 to generate a system parity data PRTc and stores the system parity data PRTc in the buffer 145. The ECC decoder, in a read operation of the semiconductor memory device 200, receives a second main data MD2 from the semiconductor memory device 200, performs an ECC decoding on the second main data MD2 by symbol basis using the second ECC 155 and the system parity data PRTc and may provide a corrected main data C_MD2 to the CPU (110). The CPU 110 provides the corrected main data C_MD2 to the host.

The command buffer 180 stores the command CMD corresponding to the request REQ and transmits the command CMD to the semiconductor memory device 200 under control of the CPU 110. The address buffer 190 stores the address ADDR and transmits the address ADDR to the semiconductor memory device 200 under control of the CPU 110.

Figure 4:
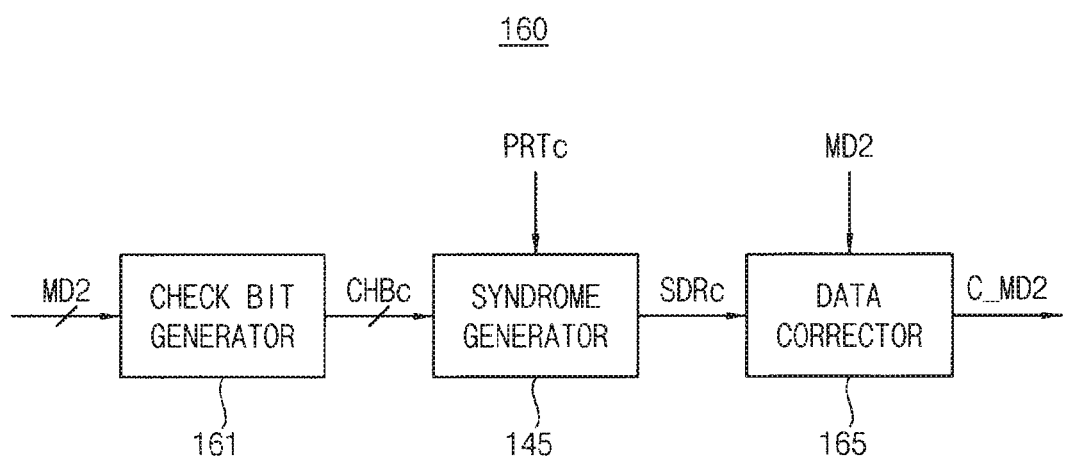
FIG. 4 is a block diagram illustrating an example of the ECC decoder in FIG. 3, according to exemplary embodiments of the present disclosure.

FIG. 4 is a block diagram illustrating an example of the ECC decoder in FIG. 3, according to exemplary embodiments of the present disclosure. Referring to FIG. 4, the ECC decoder 160 may include a check bit generator 161, a syndrome generator 163 and a data corrector 165. The check bit generator 161 receives the second main data MD2, and generates check bits CHBc corresponding to the second main data MD2 using the second ECC 155. The syndrome generator 163 compares the system parity data PRTc and the check bits CHBc by symbol basis to generate a syndrome data SDRc indicating whether the second main data MD2 includes at least one error bit and indicating a position of the at least one error bit. The data corrector 165 receives the second main data MD2 and corrects the error bits in the second main data MD2 by symbol basis based on the syndrome data SDRc to output the corrected main data C_MD2. Odd multiple error bits and a mis-corrected bit generated due to the multiple error bits in the second main data MD2 provided from the semiconductor memory device 200 are gathered in one symbol, the data corrector 165 may correct the error bits in the second main data MD2 by symbol basis.

Figure 5:
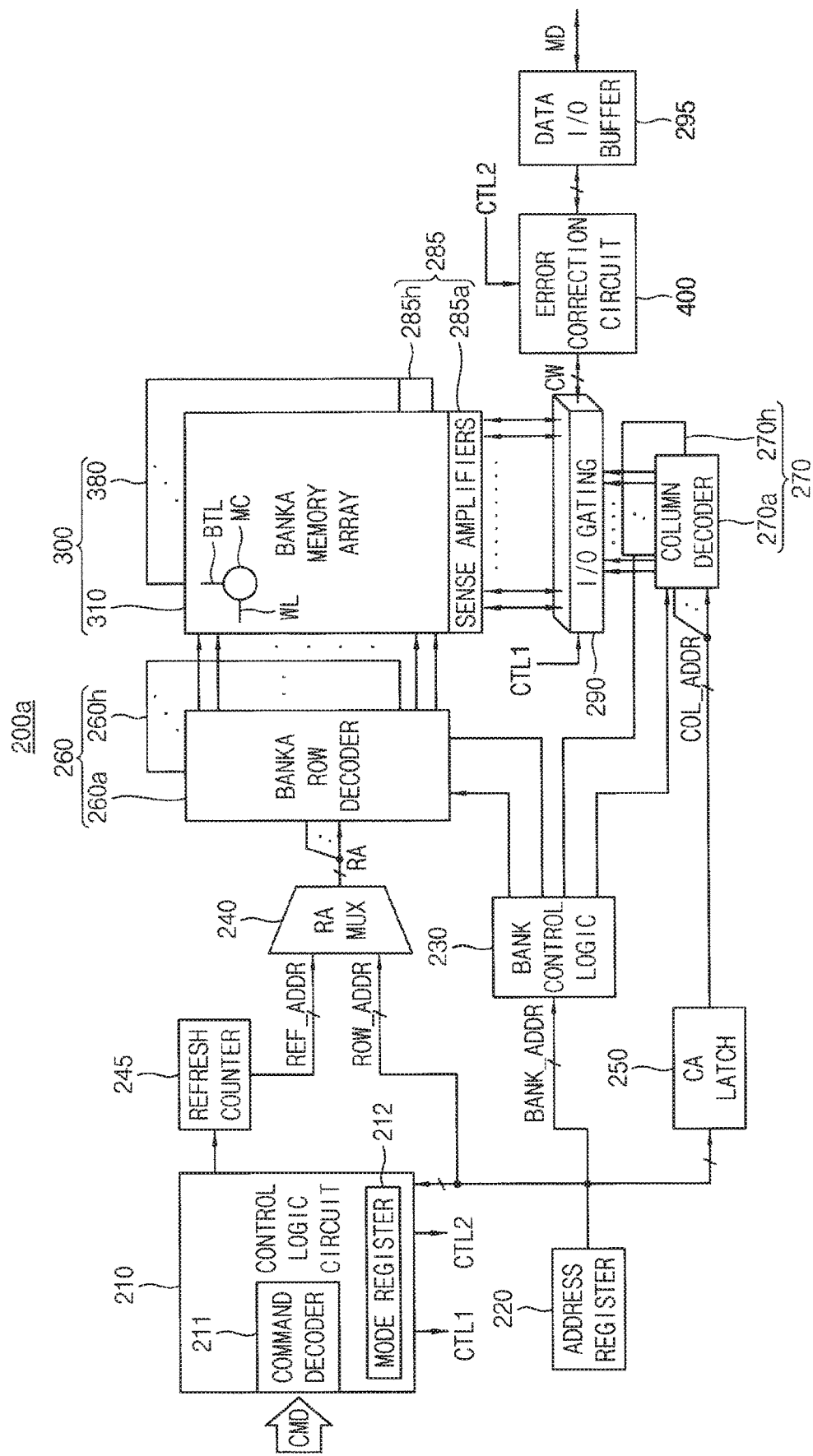
FIG. 5 is a block diagram illustrating the semiconductor memory device in FIG. 1, according to exemplary embodiments of the present disclosure.

FIG. 5 is a block diagram illustrating the semiconductor memory device in FIG. 1, according to exemplary embodiments of the present disclosure. Referring to FIG. 5, the semiconductor memory device 200 includes a control logic circuit 210, an address register 220, a bank control logic 230, a row address multiplexer 240, a column address latch 250, a row decoder 260, a column decoder 270, a memory cell array 300, a sense amplifier unit 285, an input/output (I/O) gating circuit 290, a data input/output (I/O) buffer 295, a refresh counter 245, and an error correction circuit 400.

The memory cell array 300 includes first through eighth bank arrays 310~380. The row decoder 260 includes first through eighth bank row decoders 260a~260h respectively coupled to the first through eighth bank arrays 310~380. The column decoder 270 includes first through eighth bank column decoders 270a~270h respectively coupled to the first through eighth bank arrays 310~380. The sense amplifier unit 285 includes first through eighth bank sense amplifiers 285a~285h respectively coupled to the first through eighth bank arrays 310~380. The first through eighth bank arrays 310~380, the first through eighth bank row decoders 260a~260h, the first through eighth bank column decoders 270a~270h, and first through eighth bank sense amplifiers 285a~285h may form first through eighth banks. Each of the first through eighth bank arrays 310~380 includes a plurality of memory cells MC coupled to word-lines WL and bit-lines BTL. Although the semiconductor memory device 200 is illustrated in FIG. 5 as including eight banks, exemplary embodiments of the present disclosure are not limited thereto, and the semiconductor memory device 200 may include any number of banks.

The address register 220 receives an address ADDR including a bank address BANK_ADDR, a row address ROW ADDR and a column address COL_ADDR, and a command CMD from the memory controller 100. The address register 220 may provide the received bank address BANK_ADDR to the bank control logic 230, the received row address ROW ADDR to the row address multiplexer 240, and the received column address COL_ADDR to the column address latch 250.

The bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a-270h corresponding to the bank address BANK_ADDR may be activated in response to the bank control signals.

The row address multiplexer 240 may receive the row address ROW ADDR from the address register 220, and may receive a refresh row address REF_ADDR from the refresh counter 245. The row address multiplexer 240 may selectively output one of the row address ROW ADDR the refresh row address REF_ADDR as a row address RA. The row address RA that is output from the row address multiplexer 240 may be applied to the first through eighth bank row decoders 260a-260h. The activated one of the first through eighth bank row decoders 260a-260h may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In exemplary embodiments, in a burst mode, the column address latch 250 may generate column addresses that increment from the received column address COL_ADDR. The column address latch 250 may apply the temporarily stored or generated column address to the first through eighth bank column decoders 270a-270h.

The activated one of the first through eighth bank column decoders 270a-270h may decode the column address COL_ADDR that is output from the column address latch 250, and may control the input/output gating circuit 290 to output data corresponding to the column address COL_ADDR or a mapped column address MCA. The I/O gating circuit 290 includes circuitry for gating input/output data. The I/O gating circuit 290 further includes read data latches for storing data that is output from the first through eighth bank arrays 310~380, and write drivers for writing data to the first through eighth bank arrays 310~380.

Data to be read from one bank array of the first through eighth bank arrays 310~380 may be sensed by a sense amplifier coupled to the one bank array from which the data is to be read and may be stored in the read data latches. The data stored in the read data latches is ECC-decoded by the error correction circuit 400 and may be provided to the memory controller 100 via the data I/O buffer 295.

Data (or the main data) MD to be written in one bank array of the first through eighth bank arrays 310~380 may be provided to the data I/O buffer 295 from the memory controller 100. The main data MD is provided to the error correction circuit 400. The error correction circuit 400 performs ECC encoding on the main data MD to generate a parity data and provides the I/O gating circuit 290 with codeword CW including the main data MD and the parity data. The I/O gating circuit 290 may write the main data MD and the parity data in a normal cell region (a first memory region) and a redundancy cell region (a second memory region), respectively, in the one bank array, through the write drivers.

When the error correction circuit 400 performs the ECC encoding and the ECC decoding, the error correction circuit 400 may use an ECC which is represented by a generation matrix. For example, the data structure/data format of the ECC may be a generation matrix. The ECC may include a plurality of column vectors corresponding to data bits of the data (or main data) MD, and the column vectors may be divided into a plurality of code groups corresponding to a plurality of sub data units. The data bits may be divided into a plurality of sub data units.

In addition, the column vectors may have elements to gather a mis-corrected bit and multiple error bits in one symbol, and the mis-corrected bit is generated due to the multiple error bits in the main data. The one symbol may include one sub data unit or two adjacent sub data units of the plurality of sub data units. Therefore, when the main data MD includes the multiple error bits which the error correction circuit 400 is not capable of correcting/detecting, the memory controller 100 may correct the multiple error bits in the main data MD by symbol basis at a system level because the multiple error bits and the mis-corrected bit are gathered in one symbol.

The control logic circuit 210 may control operations of the semiconductor memory device 200. For example, the control logic circuit 210 may generate control signals for the semiconductor memory device 200 to perform a write operation or a read operation. The control logic circuit 210 may include a command decoder 211 that decodes the command CMD received from the memory controller 100, and a mode register 212 that sets an operation mode of the semiconductor memory device 200. For example, the command decoder 211 may generate the control signals corresponding to the command CMD by decoding a write enable signal, a row address strobe signal, a column address strobe signal, a chip select signal, etc. The control logic circuit 210 may generate a first control signal CTL1 to control the I/O gating circuit 290, and a second control signal CTL2 to control the error correction circuit 400.

Figure 6:
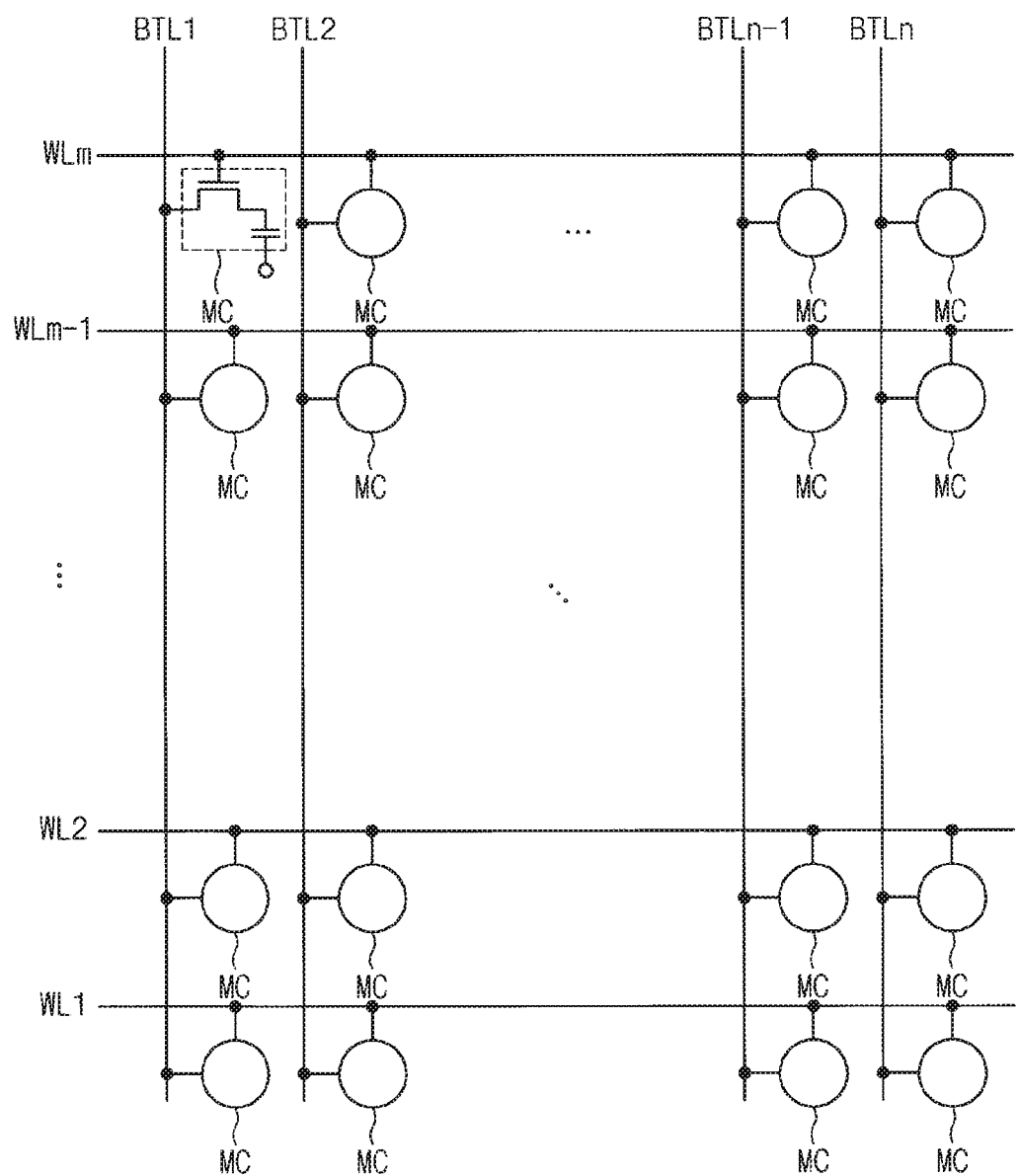
FIG. 6 illustrates an example of the first bank array in the semiconductor memory device of FIG. 5, according to exemplary embodiments of the present disclosure.

FIG. 6 illustrates an example of the first bank array in the semiconductor memory device of FIG. 5, according to exemplary embodiments of the present disclosure. Referring to FIG. 6, in the first bank array 310, a plurality of word-lines WL1~WLm (where m is a natural number greater than two), a plurality of bit-lines BTL1~BTLn (where n is a natural number greater than two), and a plurality of memory cells MCs are disposed at intersections between the word-lines WL1~WLm and the bit-lines BTL1~BTLn. Each of the memory cells MCs includes an access (cell) transistor coupled to each of the word-lines WL1~WLm and each of the bit-lines BTL1~BTLn and a storage (cell) capacitor coupled to the cell transistor.

Figure 7:
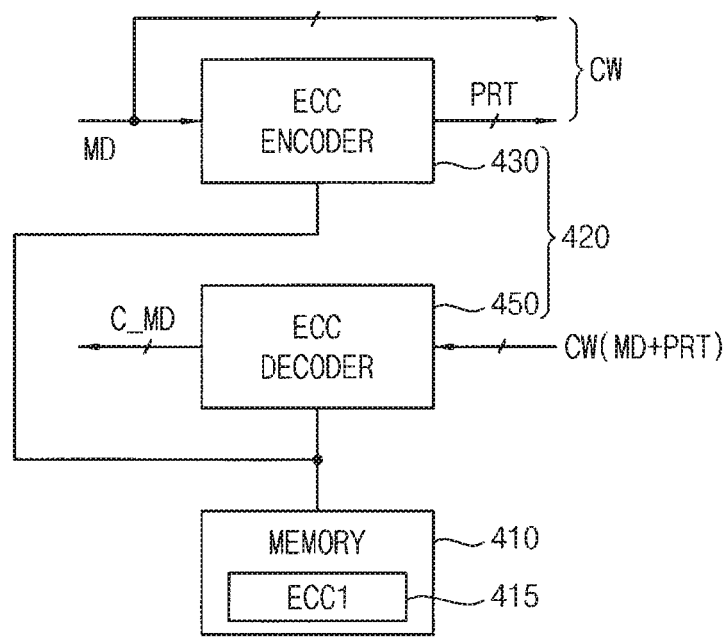
FIG. 7 is a block diagram illustrating the error correction circuit in the semiconductor memory device of FIG. 5, according to exemplary embodiments of the present disclosure.

FIG. 7 is a block diagram illustrating the error correction circuit in the semiconductor memory device of FIG. 5, according to exemplary embodiments of the present disclosure. Referring to FIG. 7, the error correction circuit 400 includes an ECC memory 410, an ECC encoder 430, and an ECC decoder 450. The ECC memory 410 stores a first ECC 415. The first ECC 415 may be represented by a generation matrix (e.g., a data format/structure of the first ECC 415 may be a generation matrix) and may include a plurality of column vectors corresponding to data bits in the main data (e.g., MD).

The ECC encoder 430 is coupled to the ECC memory 410 and may perform ECC encoding on the main data MD using the first ECC 415 stored in the ECC memory 410 to generate the parity data PRT in a write operation of the semiconductor memory device 200. The ECC encoder 430 may provide the I/O gating circuit 290 with the codeword CW including the main data MD and the parity data PRT. The ECC decoder 450 is coupled to the ECC memory 410, may receive the codeword CW including the main data MD and the parity data PRT, may perform ECC decoding on the main data MD based on the parity data PRTR using the first ECC 415 to correct and/or detect an error bit in the main data MD, and may output corrected main data C_MD.

The first ECC 415 may be a single error correction and double error detection (SECDED) code capable of correcting an error bit and detecting two error bits in the main data MD. Although it is described with reference to FIG. 7 that the ECC memory 410 is coupled to the ECC encoder 430 and the ECC decoder 450, in exemplary embodiments, the ECC memory 410 may be implemented with exclusive OR gates within the ECC encoder 430 and the ECC decoder 450.

Figure 8:
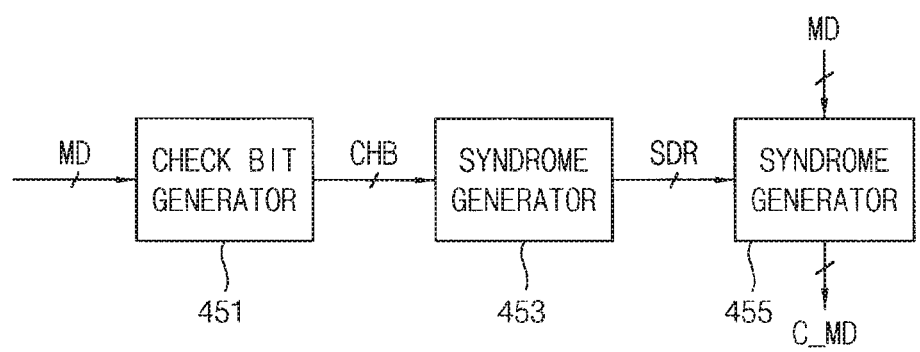
FIG. 8 is a block diagram illustrating the ECC decoder in the error correction circuit of FIG. 7, according to exemplary embodiments of the present disclosure.

FIG. 8 is a block diagram illustrating the ECC decoder in the error correction circuit of FIG. 7, according to exemplary embodiments of the present disclosure. Referring to FIG. 8, the ECC decoder 450 includes a check bit generator 451, a syndrome generator 453, and a data corrector 455. The check bit generator 451 generates check bits CHB based on the data bits in the main data MD using the first ECC 415. The syndrome generator 453 generates syndrome data SDR indicating whether an error bit occurs and a position of the error bit based on a comparison of the check bits CHB and parity bits of the parity data PRT. The data corrector 455 receives the main data MD and the syndrome data SDR, corrects the error bit in the main data MD, and outputs the corrected main data C_MD.

In FIGS. 7 and 8, the main data MD includes $2^p$-bit of the data bits (where p is an integer equal to or greater than six), and the parity data PRT includes (p+2)-bit parity bits. In other exemplary embodiments, the main data MD includes $3*2^q$-bit off the data bits (where q is an integer equal to or greater than six), and the parity data PRT includes (q+2)-bit parity bits.

Figure 9:
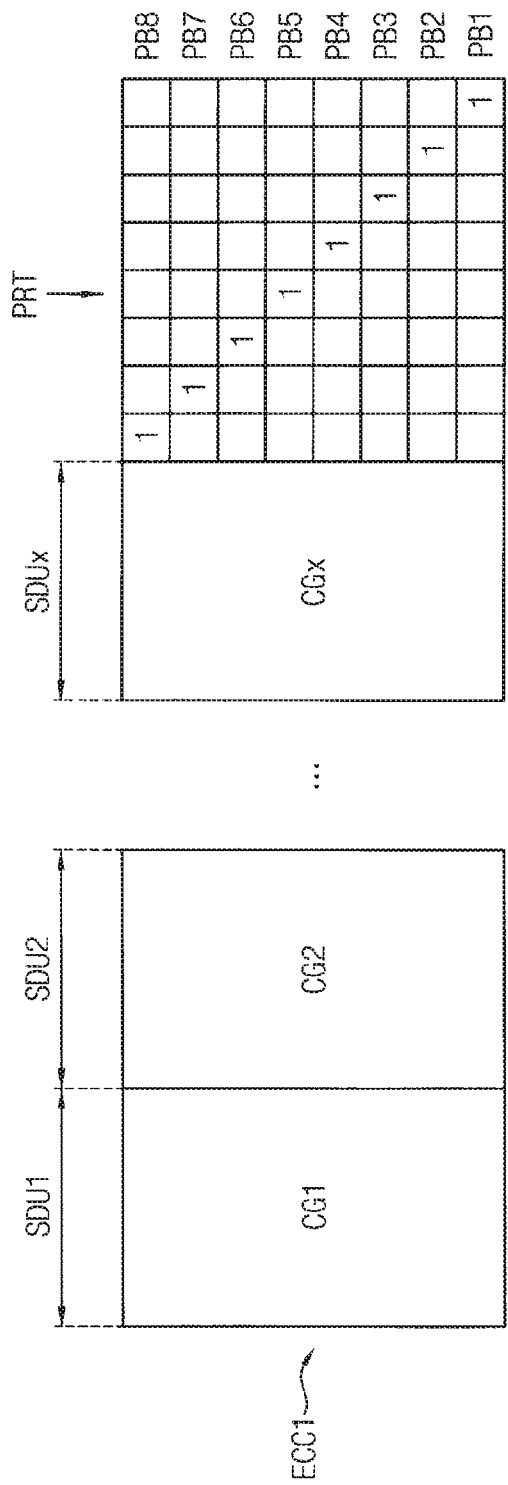
FIG. 9 illustrates relationships of the first ECC, and the parity bits used in the error correction circuit of FIG. 7, according to exemplary embodiments of the present disclosure.

FIG. 9 illustrates relationships of the first ECC, and the parity bits used in the error correction circuit of FIG. 7, according to exemplary embodiments of the present disclosure. In FIG. 9, it is assumed that the main data MD includes a plurality of sub data units SDU1~SDUx, and the parity data PRT includes 8-bit parity bits PB1~PB8. In FIG. 9, it is assumed that x is a natural number equal to or greater than six. Referring to FIG. 9, the first ECC 415 may be divided into a plurality of code groups CG1~CGx corresponding to the plurality of sub data units SDU1~SDUx.

Figure 10:
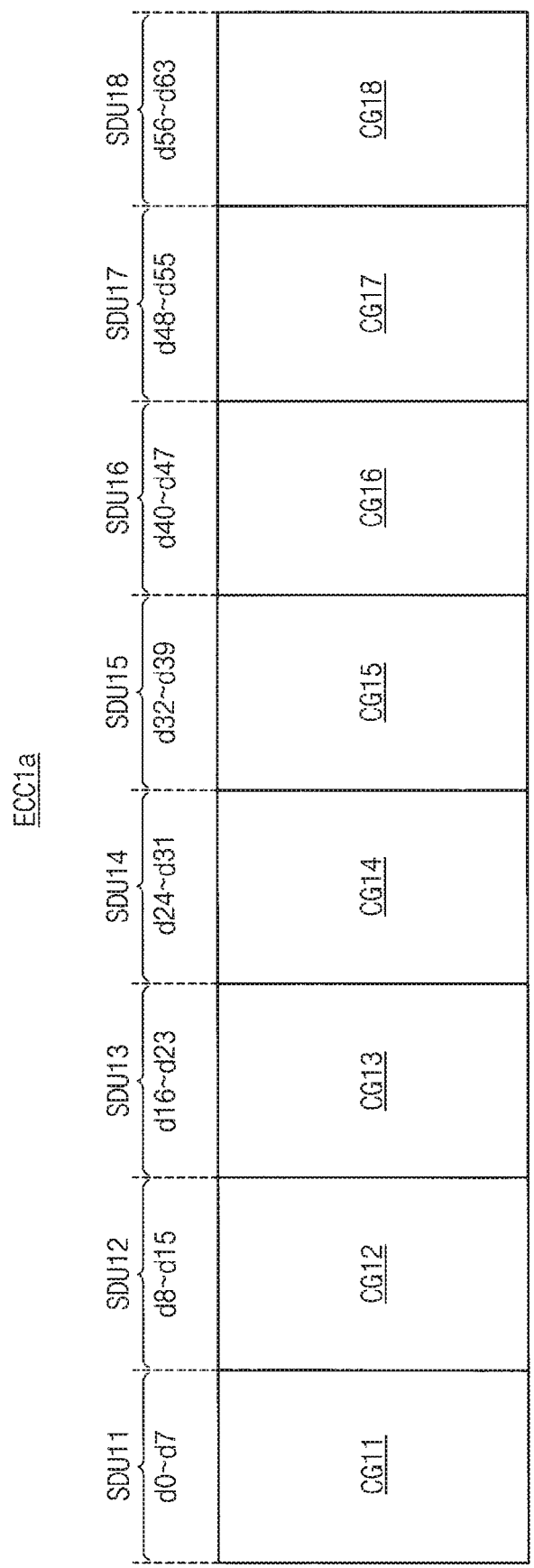
FIG. 10 illustrates an example of the first ECC according to exemplary embodiments of the present disclosure.

FIG. 10 illustrates an example of the first ECC according to exemplary embodiments of the present disclosure. In FIG. 10, it is assumed that the main data MD includes 64-bit data bits d0~d63. That is, it is assumed that x is six (6) in FIG. 10. Referring to FIG. 10, the data bits d0~d63 of the main data MD may be divided into first through eighth sub data units SDU11~SDU18. Each of the first through eighth sub data units SDU11~SDU18 includes 8-bit data bits. A first ECC ECC1a includes first through eighth code groups CG11~CG18 corresponding to the first through eighth sub data units SDU11~SDU18.

Figure 11A:
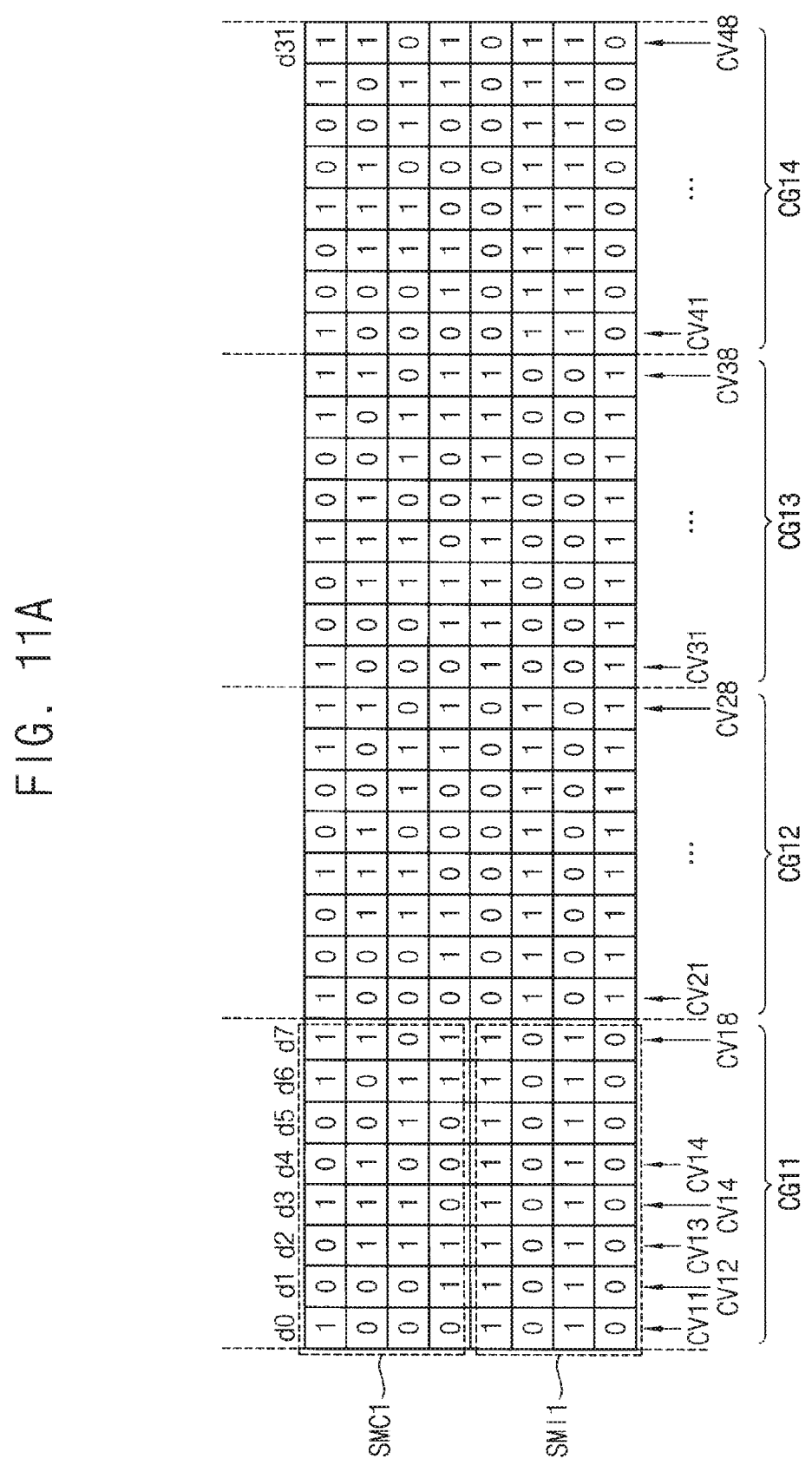
Figure 11B:
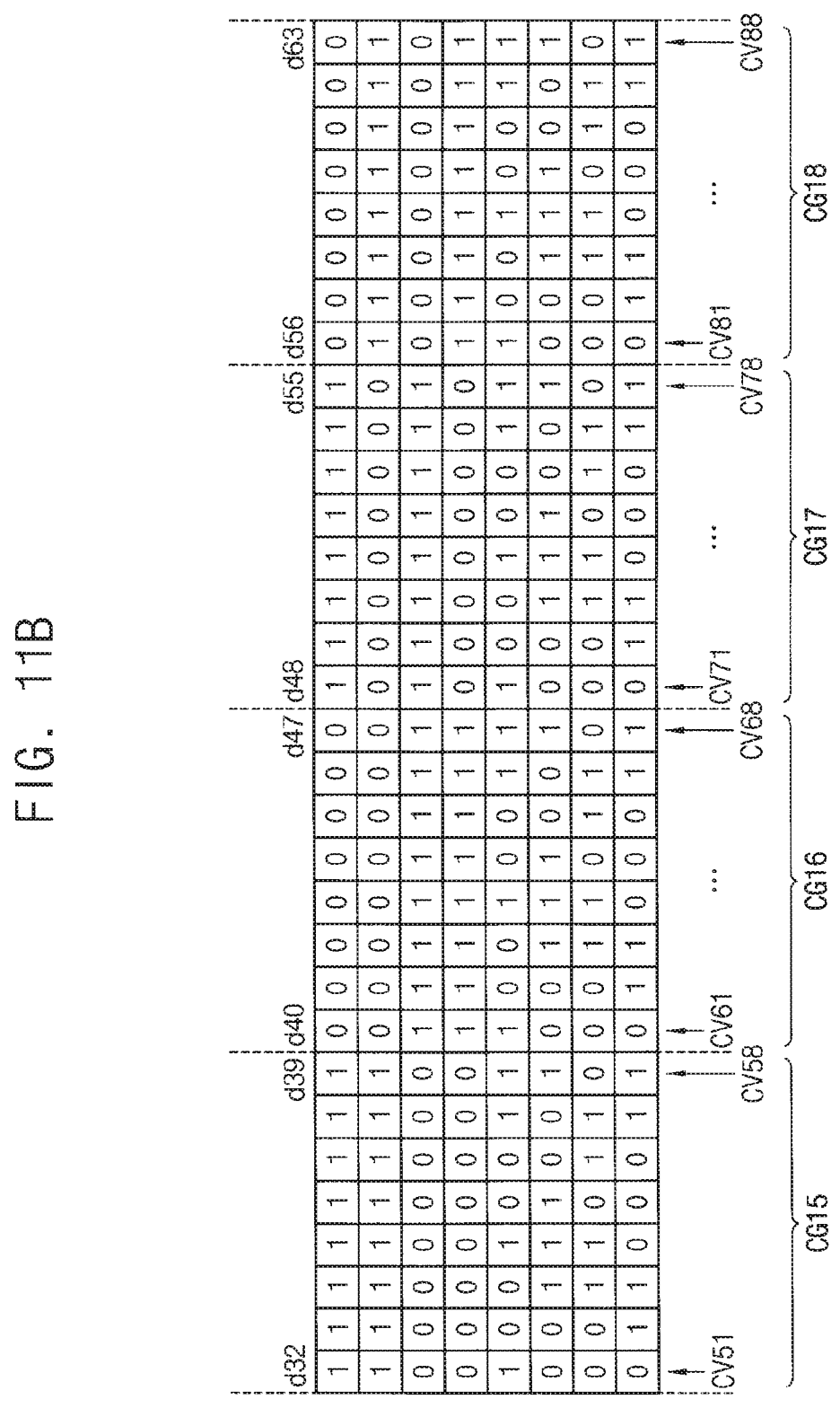

FIGS. 11A and 11B illustrate the first through eighth code groups in FIG. 10.

Referring to FIGS. 11A and 11B, the first code group CG11 includes column vectors CV11~CV18 corresponding to the data bits d0~d7 of the first sub data unit SDU11, the second code group CG12 includes column vectors CV21~CV28 corresponding to the data bits d8~d15 of the second sub data unit SDU12, the third code group CG13 includes column vectors CV31~CV38 corresponding to the data bits d16~d23 of the third sub data unit SDU13, and the fourth code group CG14 includes column vectors CV41~CV48 corresponding to the data bits d24~d31 of the fourth sub data unit SDU14.

In addition, the fifth code group CG15 includes column vectors CV51~CV58 corresponding to the data bits d32~d39 of the fifth sub data unit SDU15, the sixth code group CG16 includes column vectors CV61~CV68 corresponding to the data bits d40~d47 of the sixth sub data unit SDU16, the seventh code group CG17 includes column vectors CV71~CV78 corresponding to the data bits d48~d55 of the seventh sub data unit SDU17, and the eighth code group CG18 includes column vectors CV81~CV88 corresponding to the data bits d56~d63 of the eighth sub data unit SDU18.

Referring to FIG. 11A, each of the first through fourth code groups CG11~CG14 may include a common sub matrix SMC1 and an individual sub matrix SMI1, the common sub matrix SMC1 of each of the first through fourth code groups CG11~CG14 have same elements and the individual sub matrix SMI1 of each of the first through fourth code groups CG11~CG14 have different elements.

Referring to FIG. 11B, each of the fifth through eighth code groups CG15~CG18 may include a common sub matrix and an individual sub matrix, the common sub matrix of each of the fifth through eighth code groups CG15~CG18 have same elements and the individual sub matrix of each of the fifth through eighth code groups CG15~CG18 have different elements.

Therefore, each of the first through eighth code groups CG11~CG18 includes a common sub matrix having same elements and an individual sub matrix in each of the first through eighth code groups CG11~CG18 includes elements having a same logic level by a row basis. Accordingly, when the main data MD includes multiple error bits which the first ECC ECC1a cannot correct and/or detect, a mis-corrected bit generated due to the multiple error bits may be gathered in one or two sub data units altogether with the multiple error bits.

FIG. 12 is a table illustrating a result of exclusive OR operation of three column vectors in the first code group in FIG. 11A. In FIG. 12, there is illustrated that a first result of exclusive OR operation of the column vectors CV11 and CV12 and a second result of exclusive OR operation of the first result and each of the column vectors CV13~CV18. Referring to FIG. 12, when an exclusive OR operation is performed on first result and each of the column vectors CV13~CV18, the second result matches respective one of the column vectors CV14, CV13, CV18, CV17, CV16, and CV15.

That is, when an exclusive OR operation is performed on three different column vectors in the first code group CG11, a result of the exclusive OR operation matches one of the column vectors in the first code group CG11 except the on three different column vectors, because the column vectors CV11~CV18 in the first code croup CG1 include high level elements of 3, 3, 5, 5, 3, 3, 5 and 5 respectively and this pattern is repeated in other code groups. Therefore, when the main data MD in the codeword includes odd multiple error bits, a mis-corrected bit generated due to the odd multiple error bits may be included in the sub data unit including the odd error bits. Accordingly, the column vectors of the first ECC ECC1a may have elements to gather a mis-corrected bit and multiple error bits in one symbol and the mis-corrected bit is generated due to the multiple error bits. The one symbol may include one or two adjacent sub data units.

Although a result of exclusive OR operation of three vectors in the first code group CG11 are referred to for convenience of explanation, it is to be understood that each result of a bitwise exclusive OR operation of any different three column vectors in each of the second through fourth code groups CG12~CG14 may be similar.

FIG. 13 illustrates another example of the first ECC according to exemplary embodiments of the present disclosure. In FIG. 13, it is assumed that the main data MD includes 96-bit data bits d0~d95. That is, it is assumed that x is 12 in FIG. 10. Referring to FIG. 13, the data bits d0~d95 of the main data MD may be divided into first through 12th sub data units SDU21~SDU212. Each of the first through 12th sub data units SDU21~SDU212 sub data units SDU21~SDU212 includes 8-bit data bits. A first ECC, ECC1b, includes first through 12th code groups CG21~CG212 corresponding to the first through 12th sub data units SDU21~SDU212.

Figure 14A:
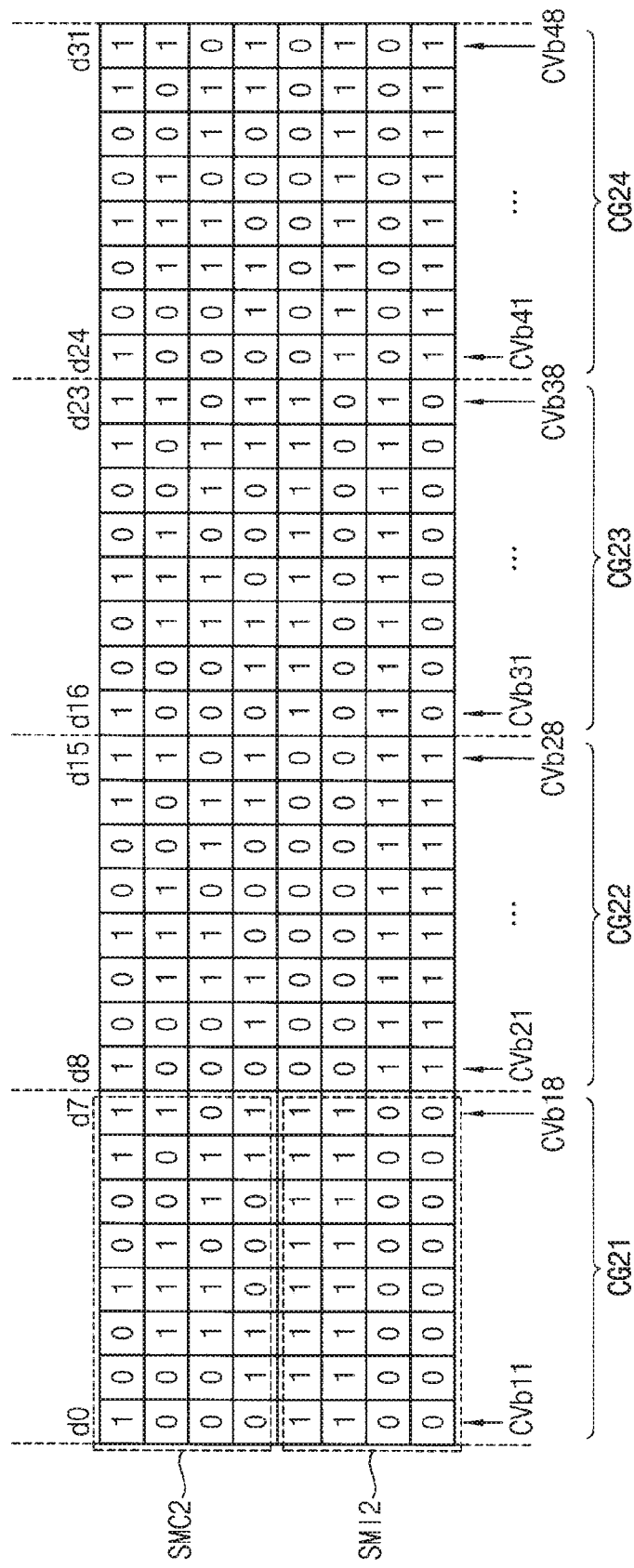
Figure 14B:
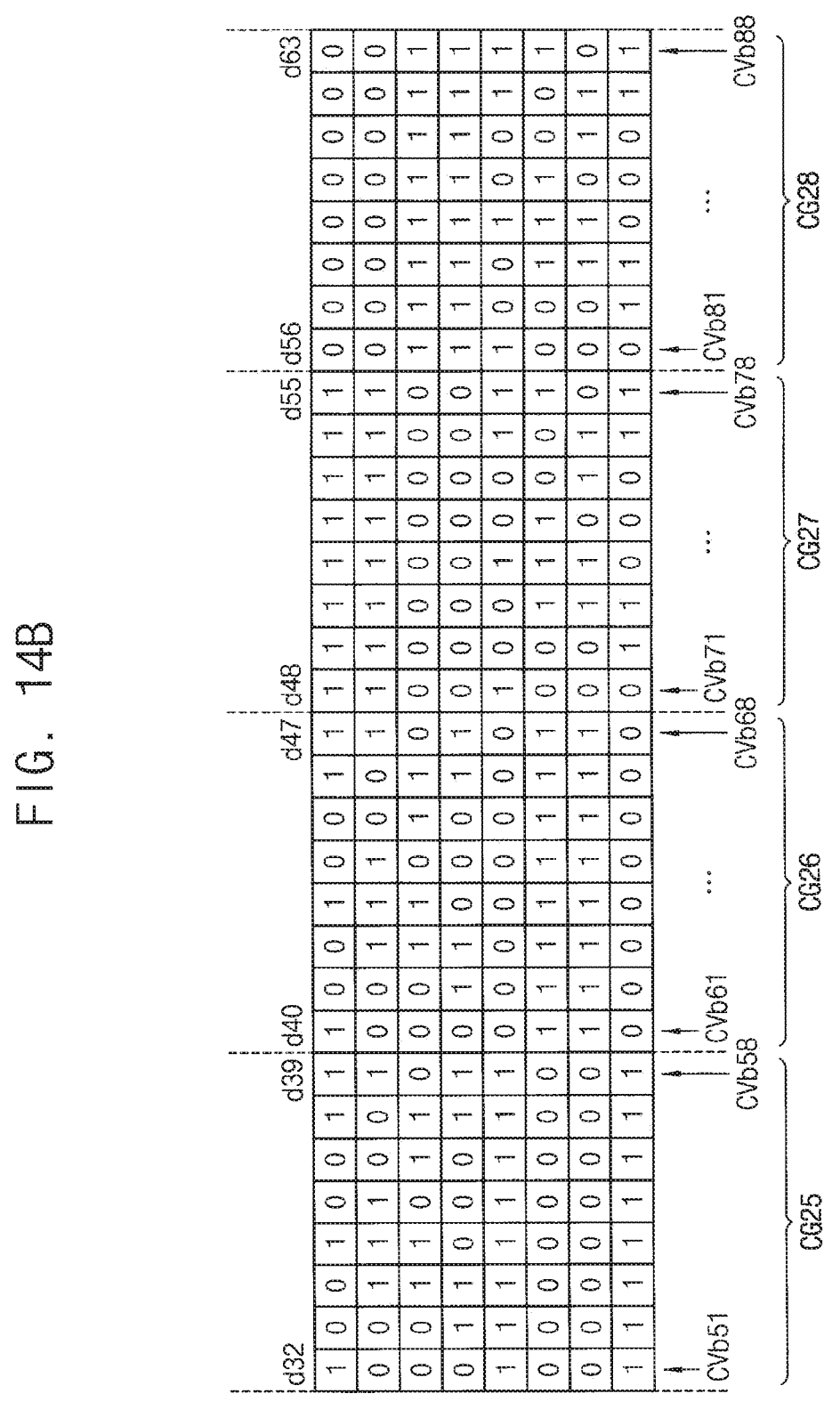
Figure 14C:
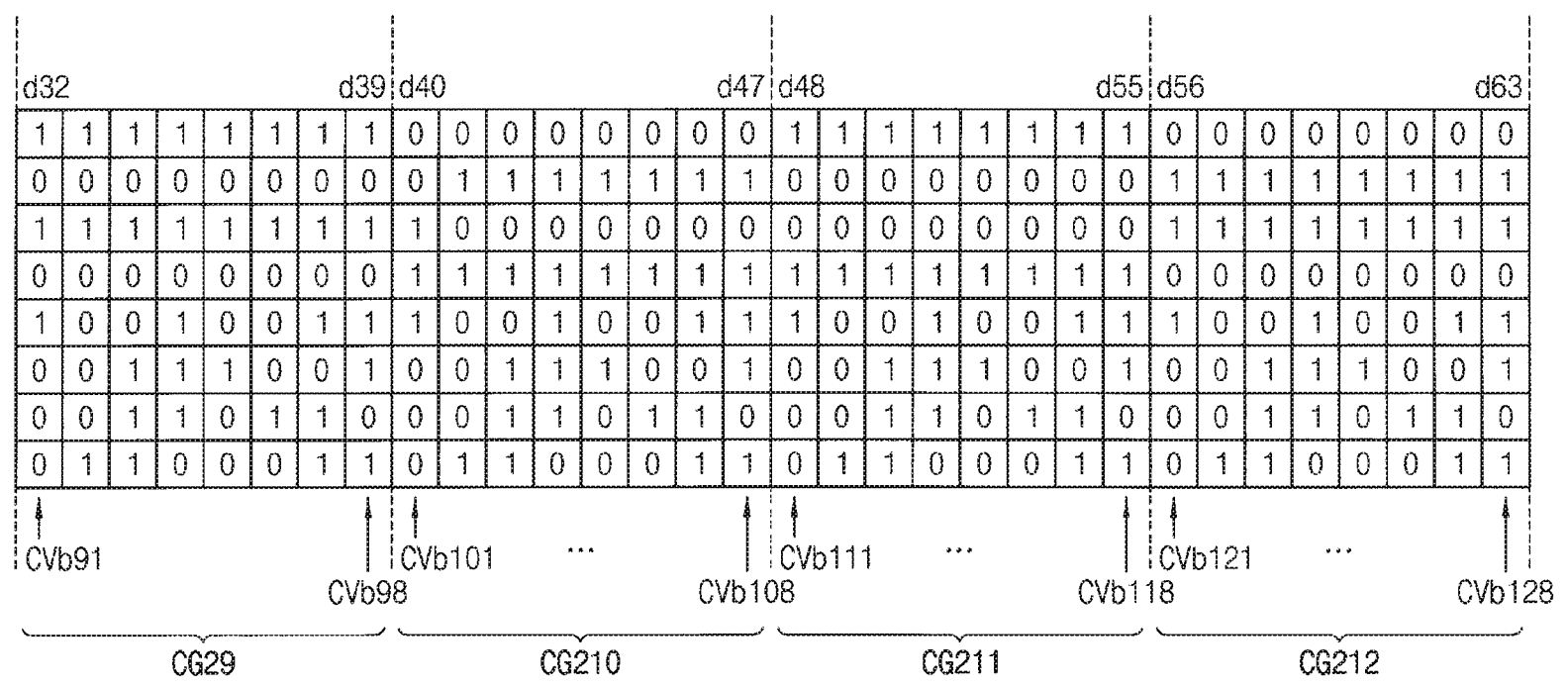

FIGS. 14A through 14C illustrate the first through 12th code groups in FIG. 13. Referring to FIG. 14A through 14C, the first code group CG21 includes column vectors CVb11~CVb18 corresponding to the data bits d0~d7 of the first sub data unit SDU21, the second code group CG22 includes column vectors CVb21~CVb28 corresponding to the data bits d8~d15 of the second sub data unit SDU22, the third code group CG23 includes column vectors CVb31~CVb38 corresponding to the data bits d16~d23 of the third sub data unit SDU23, and the fourth code group CG24 includes column vectors CVb41~CVb48 corresponding to the data bits d24~d31 of the fourth sub data unit SDU24.

In addition, the fifth code group CG25 includes column vectors CVb51~CVb58 corresponding to the data bits d32~d39 of the fifth sub data unit SDU25, the sixth code group CG26 includes column vectors CVb61~CVb68 corresponding to the data bits d40~d47 of the sixth sub data unit SDU26, the seventh code group CG27 includes column vectors CVb71~CVb78 corresponding to the data bits d48~d55 of the seventh sub data unit SDU27, and the eighth code group CG28 includes column vectors CVb81~CVb88 corresponding to the data bits d56~d63 of the eighth sub data unit SDU28.

In addition, the ninth code group CG29 includes column vectors CVb91~CVb98 corresponding to the data bits d64~d71 of the ninth sub data unit SDU29, the tenth code group CG210 includes column vectors CVb101~CVb108 corresponding to the data bits d72~d79 of the tenth sub data unit SDU10, the 11th code group CG211 includes column vectors CVb111~CVb118 corresponding to the data bits d80~d87 of the 11th sub data unit SDU111, and the 12th code group CG212 includes column vectors CVb121~CVb128 corresponding to the data bits d88~d95 of the 11th sub data unit SDU212.

Referring to FIG. 14A, each of the first through fourth code groups CG21~CG24 may include a common sub matrix SMC2 and an individual sub matrix SMI2, the common sub matrix SMC2 of each of the first through fourth code groups CG21~CG24 have same elements and the individual sub matrix SM21 of each of the first through fourth code groups CG21~CG24 have different elements.

Referring to FIGS. 14B and 14C, each of the fifth through eighth code groups CG25~CG28 and each of the ninth through 12th code groups CG29~CG212 may include a common sub matrix having same elements and an individual sub matrix having different elements. Therefore, each of the first through 12th code groups CG21~CG212 includes a common sub matrix having same elements and an individual sub matrix in each of the first through 12th code groups CG21~CG212 includes elements having a same logic level by a row basis. Accordingly, when the main data MD includes multiple error bits which the first ECC ECC1$b$ cannot correct and/or detect, a mis-corrected bit generated due to the multiple error bits may be gathered in one or two sub data units altogether with the multiple error bits.

Figure 15:
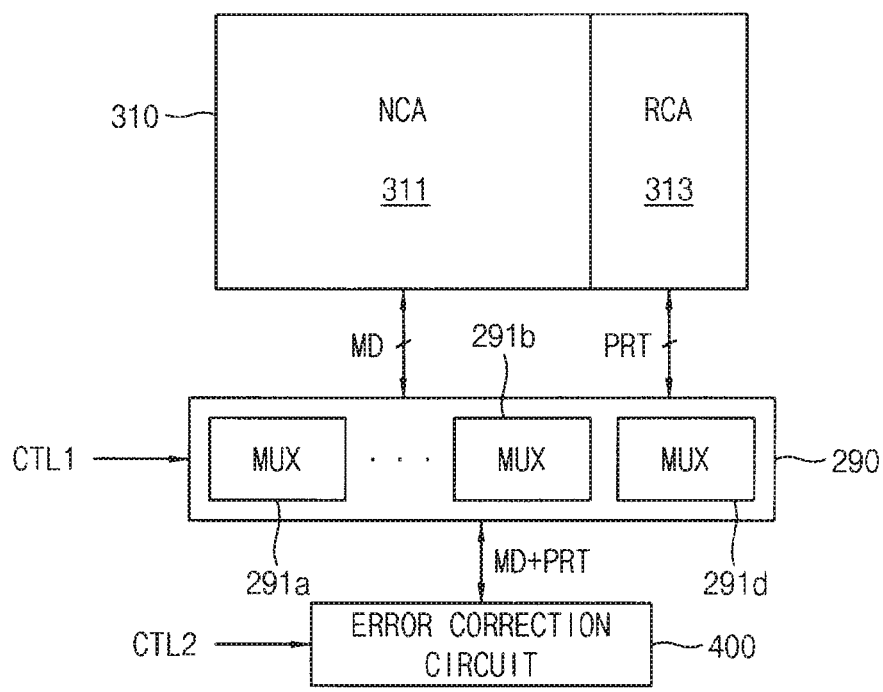
FIG. 15 illustrates the first bank array, the I/O gating circuit, and the error correction circuit in the semiconductor memory device of FIG. 5, according to exemplary embodiments of the present disclosure.

FIG. 15 illustrates the first bank array, the I/O gating circuit, and the error correction circuit in the semiconductor memory device of FIG. 5, according to exemplary embodiments of the present disclosure. Referring to FIG. 15, the first bank array 310 of the semiconductor memory device 200 includes a normal cell region 311 and a redundancy cell region 313. The I/O gating circuit 290 includes a plurality of switches 291$a$, 291$b$ and 291$d$. The plurality of switches 291$a$, 291$b$ and 291$d$ may be, for example, multiplexers. The switches 291$a$ and 291$b$ are connected to the normal cell region 311, and the switch 291$d$ is connected to the redundancy cell region 313. The I/O gating circuit 290 receives the main data MD and the parity data PRT associated with the main data MD from the error correction circuit 400, stores the main data MD in the normal cell region 311, and stores the parity data PRT in the redundancy cell region 313. The I/O gating circuit 290 performs the above-described operation based on the first control signal CTL1 received from the control logic circuit 210, and the error correction circuit 400 performs ECC encoding and ECC decoding based on the second control signal CTL2 received from the control logic circuit 210.

Figure 16:
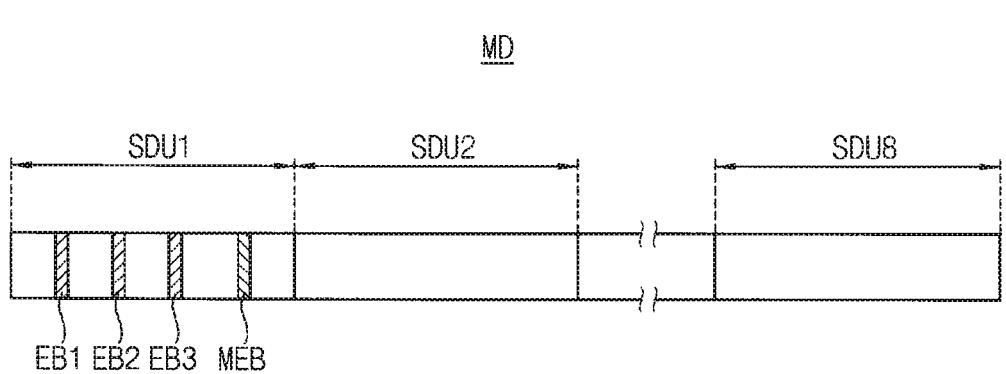
FIG. 16 illustrates an example of the main data when a sub data unit in the main data includes three error bits.

FIG. 16 illustrates an example of the main data when a sub data unit in the main data includes three error bits. Referring to FIG. 16, the main data MD read from the normal cell region 311 includes first through eighth sub data units SDU1~SDU8 and the first sub data unit SUD1 includes a first error bit EB1, a second error bit EB2 and a third error bit EB3. In addition, the first sub data unit SUD1 further includes a mis-corrected bit MEB generated due to the first error bit EB1, the second error bit EB2 and the third error bit EB3.

Since first ECC ECC1$a$ which is explained with reference to FIGS. 10 through 11B, is a SECDED code, the error correction circuit 400 cannot correct and cannot detect odd error bits when the main data MD includes multiple odd error bits and the mis-corrected bit MEB may be generated. However, since the first ECC ECC1$a$ includes column vectors having elements to gather the mis-corrected bit MEB and the first error bit EB1, the second error bit EB2 and the third error bit EB3 in one symbol, the error correction circuit 130 in the memory controller 100 may correct the mis-corrected bit MEB and the first error bit EB1, the second error bit EB2 and the third error bit EB3 in the first sub data unit SDU1 by symbol basis.

Figure 17:
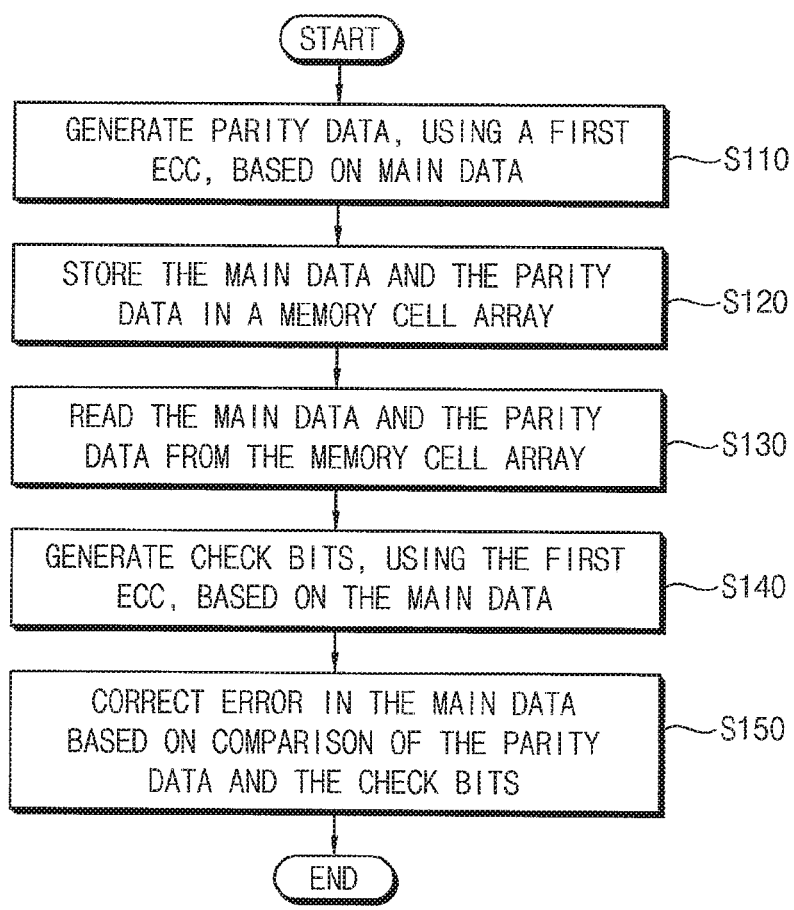
FIG. 17 is a flow chart illustrating a method of operating a semiconductor memory device, according to exemplary embodiments of the present disclosure.

FIG. 17 is a flow chart illustrating a method of operating a semiconductor memory device, according to exemplary embodiments of the present disclosure. Referring to FIGS. 5 through 17, in a method of operating a semiconductor memory device 200 including a memory cell array 300, an error correction circuit 400 generates a parity data PRT based on the main data MD, by using a first ECC 415 (S110). The main data MD includes $2^p$-bit of data bits (where p is an integer equal to or greater than six), the parity data PRT includes (p+2)-bit parity bits, and the data bits of the main data MD may be divided into first through eighth sub data units, each including (p+2) bits. The first ECC 415 may be represented by a generation matrix, may include a plurality of column vectors, and the column vectors may be divided into first through eighth code groups corresponding to the first through eighth sub data units, respectively. The column vectors may have elements to gather a mis-corrected bit and multiple odd error bits in the main data in one symbol and the mis-corrected bit is generated by the multiple odd error bits.

The error correction circuit 400 stores the main data MD and the parity data PRT in the memory cell array 300 via an I/O gating circuit 290 (S220). The error correction circuit 400 reads the main data MD and the parity data PRT from the memory cell array 300 via the I/O gating circuit 290 (S230). The error correction circuit 400 generates check bits CHB based on the main data MD, by using the first ECC 415 (S140). The error correction circuit 400 corrects an error bit in the main data MD based on a comparison of the parity data PRT and the check bits CHB (S150).

Although the main data MD includes odd error bits which the error correction circuit 400 cannot correct and/or detect, the first ECC 415 has column vectors to gather the odd error bits and a mis-corrected bit due to the odd error bits in one symbol, the memory controller 100 may correct the odd error bits and the mis-corrected bit by symbol basis.

Figure 18:
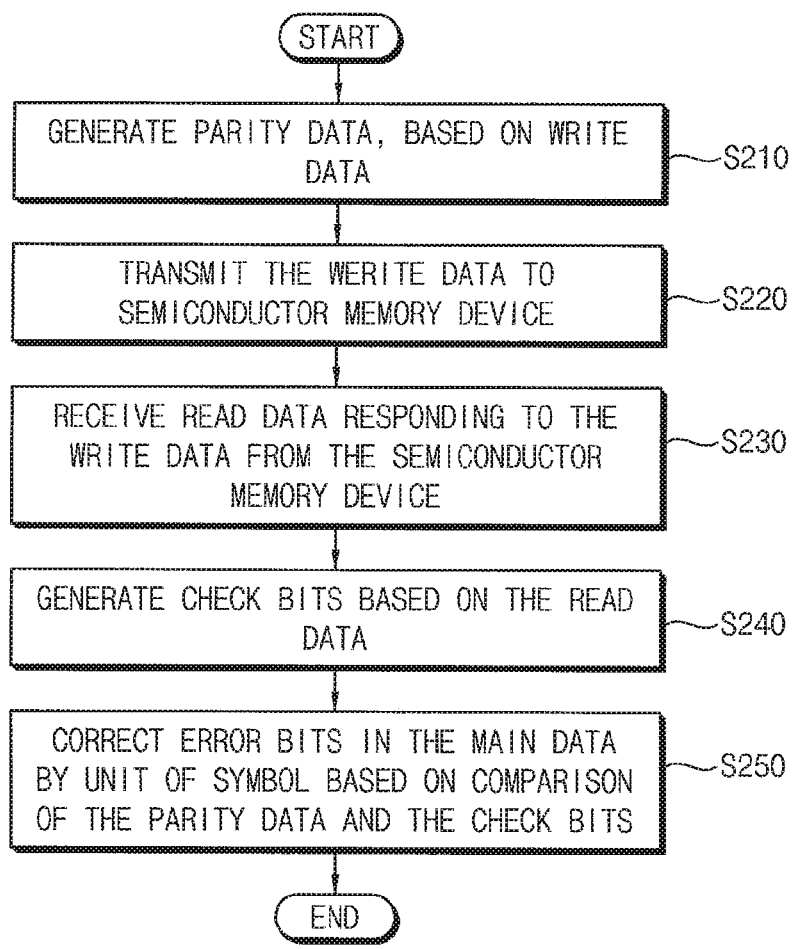
FIG. 18 is a flow chart illustrating a method of operating a memory system, according to exemplary embodiments of the present disclosure.

FIG. 18 is a flow chart illustrating a method of operating a memory system, according to exemplary embodiments of the present disclosure. Referring to FIGS. 1 through 16 and 18, in a method of operating a memory system 20 including a semiconductor memory device 200 and a memory controller 100 that controls the semiconductor memory device 200, an error correction circuit 130 in the memory controller 30 generates a system parity data PRTc based on a write data to be transmitted to the semiconductor memory device 200 by using a second ECC 155 (S210), and stores the system parity data PRTc in a buffer 145. The memory controller 100 transmits the write data to the semiconductor memory device 200 (S220). An error correction circuit 400 in the semiconductor memory device 200 performs an ECC encoding on the write data using a first ECC 415 to generate a parity data and stores the write data and the parity data in the memory cell array 300.

Figure 19:
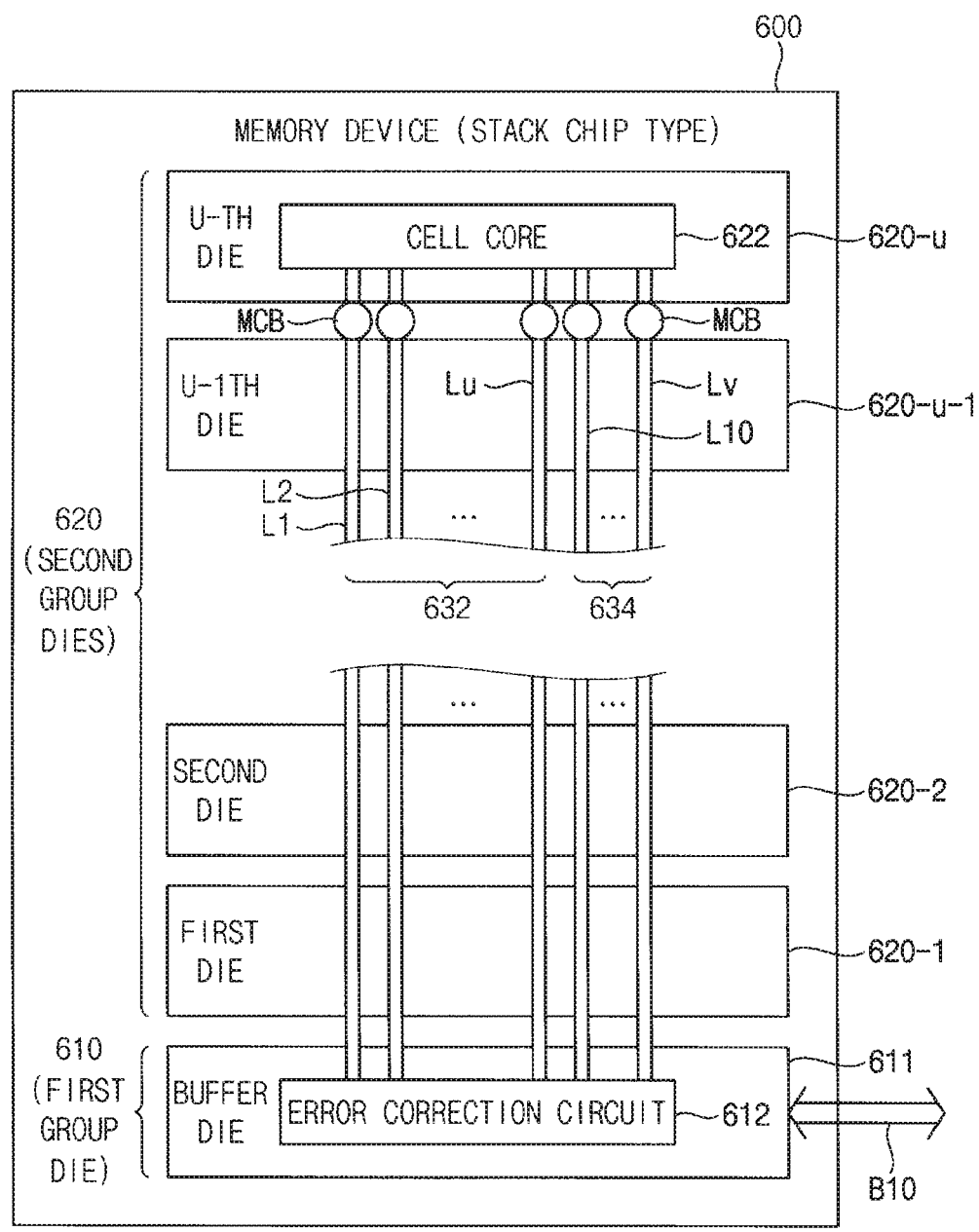
FIG. 19 is a block diagram illustrating a semiconductor memory device, according to exemplary embodiments of the present disclosure.

The error correction circuit 400 in the semiconductor memory device 200 reads the data and the parity data from the memory cell array 300 in response to a read command, performs an ECC decoding on the read data using the first ECC 415 and transmits the read data to the memory controller 100. The memory controller 100 receives the read data responding to the write data from the semiconductor memory device 200 (S230). An ECC decoder 160 in the memory controller 100 generates check bits CHBc based on the read data by using the second ECC 155 (S240). The ECC decoder 160 corrects multiple error bits in the read data by symbol basis based on comparison of the system parity data PRTc and the check bits CHBc FIG. 19 is a block diagram illustrating a semiconductor memory device, according to exemplary embodiments of the present disclosure. Referring to FIG. 19, a semiconductor memory device 600 may include a first group die 610 and second group dies 620 providing a soft error analyzing and correcting function in a stacked chip structure. The second group dies 620 may be a high-bandwidth memory (HBM). The first group die 610 may include at least one buffer die 611. The second group dies 620 may include a plurality of memory dies 620-1 to 620-u (u is a natural number greater than two) which is stacked on the first group die 610 and convey data through a plurality of through a plurality of silicon via (TSV) lines.

Each of the memory dies 620-1 to 620-p may include a cell core 622 and the cell core 622 may include a memory cell array including a data region and a parity region, an I/O gating circuit and a control logic circuit. The buffer die 611 may include an error correction circuit 612 which corrects a transmission error using the transmission parity bits when a transmission error is detected from the transmission data received through the TSV lines and generate error-corrected data. The error correction circuit 612 may be referred to as a via error correction circuit. The semiconductor memory device 600 may be a stack chip type memory device or a stacked memory device which conveys data and control signals through the TSV lines. The TSV lines may also be called through electrodes.

A transmission error which occurs at the transmission data may be due to noise which occurs at the TSV lines. Since data fail due to the noise occurring at the TSV lines may be distinguishable from data fail due to a false operation of the memory die, it may be regarded as soft data fail (or a soft error). The soft data fail may be generated due to transmission fail on a transmission path and may be detected and remedied by an ECC operation. For example, when the transmission data is 64-bit data, the transmission parity bits may be set to 8 bits. However, the scope and spirit of the present disclosure are not limited thereto. The number of transmission parity bits may increase or decrease. With the above description, a TSV line group 632 which is formed at one memory die 620-u may include 64 TSV lines L1 to Lu, and a parity TSV line group 634 may include 8 TSV lines L10 to Lv. The TSV lines L1 to Lu of the data TSV line group 632 and the parity TSV lines L10 to Lv of the parity TSV line group 634 may be connected to micro bumps MCB which are correspondingly formed among the memory dies 620-1 to 620-u. Each of the memory dies 620-1 to 620-u may include DRAM cells each including at least one access transistor and one storage capacitor.

The semiconductor memory device 600 may have a three-dimensional (3D) chip structure or a 2.5D chip structure to communicate with the host through a data bus B10. The buffer die 610 may be connected with the host through the data bus B10. The error correction circuit 612 may determine whether a transmission error occurs at the transmission data received through the data TSV line group 632, based on the transmission parity bits received through the parity TSV line group 634. When a transmission error is detected, the error correction circuit 612 may correct the transmission error on the transmission data using the transmission parity bits. When the transmission error is uncorrectable, the error correction circuit 612 may output information indicating occurrence of an uncorrectable data error.

The error correction circuit 612 may employ the error correction circuit 400 of FIG. 7. Therefore, the error correction circuit 612 may include an ECC memory that stores a first ECC, an ECC encoder and an ECC decoder. The error correction circuit 612 may perform an ECC encoding and an ECC decoding by using the first ECC and the first ECC may include a plurality of column vectors to gather multiple odd error bits and a mis-corrected bit due to the multiple odd error bits in one symbol when a read main data includes the multiple odd error bits.

Figure 20:
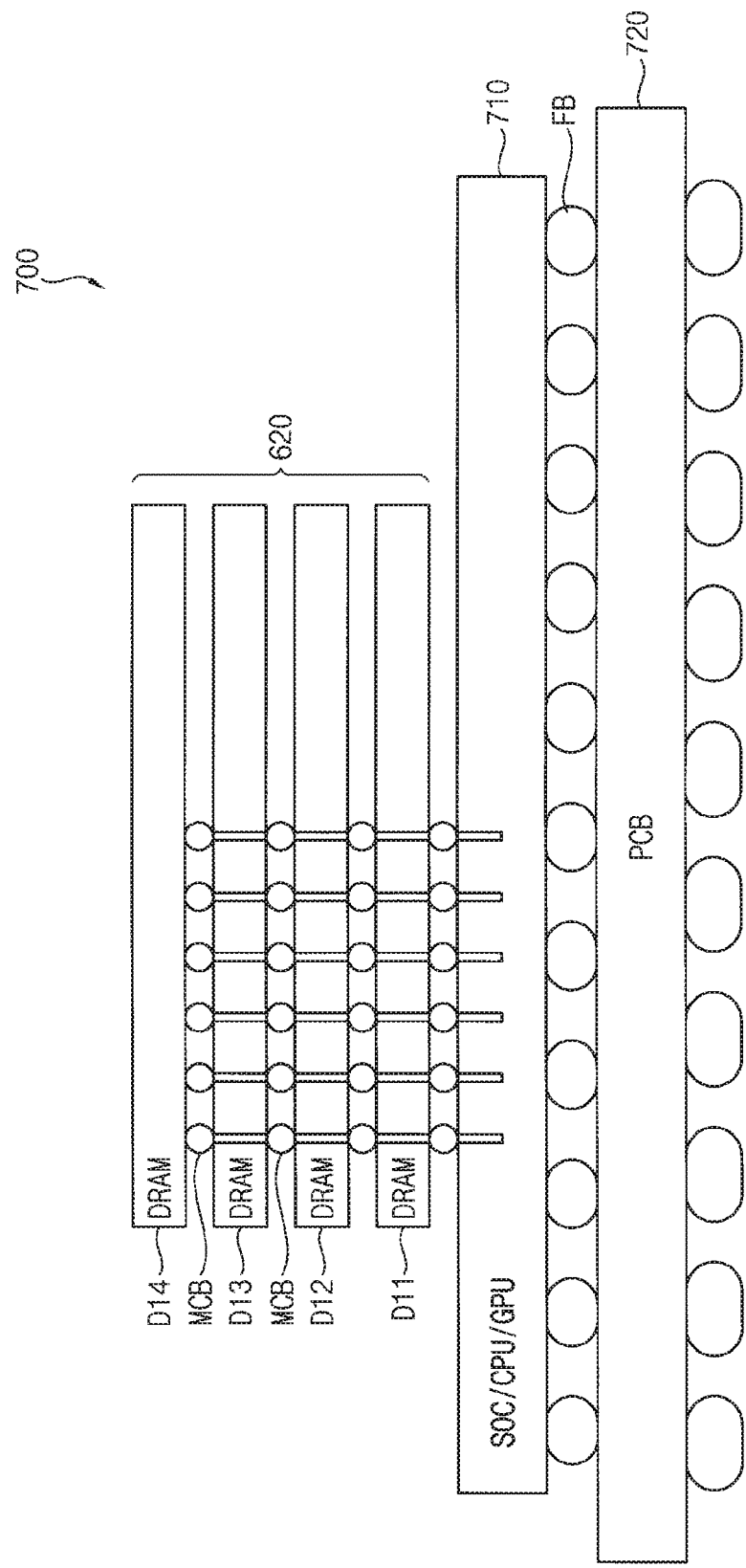
FIG. 20 is a cross-sectional view of a 3D chip structure employing the semiconductor memory device of FIG. 19, according to exemplary embodiments of the present disclosure.

FIG. 20 is a cross-sectional view of a 3D chip structure employing the semiconductor memory device of FIG. 19, according to exemplary embodiments of the present disclosure. FIG. 20 shows a 3D chip structure 700 in which a host and a HBM are directly connected without an interposer layer. Referring to FIG. 20, a host die 710 such as a system-on-chip (SoC), a central processing unit (CPU), or a graphic processing unit (GPU) may be disposed on a printed circuit board (PCB) 720 using flip chip bumps FB. Memory dies D11 to D14 may be stacked on the host die 720 to implement a HBM structure 620 as the memory dies in FIG. 19. In FIG. 20, the buffer die 610 or a logic die of FIG. 19 is omitted. However, the buffer die 610 or the logic die may be disposed between the memory die D11 and the host die 720. The buffer die may include an error correction circuit, and the error correction circuit may perform an ECC encoding and an ECC decoding by using a first ECC. The first ECC may include a plurality of column vectors to gather multiple odd error bits and a mis-corrected bit due to the multiple odd error bits in one symbol when a read main data includes the multiple odd error bits. To implement the HBM (620) structure, TSV lines may be formed at the memory dies D11 and D14. The TSV lines may be electrically connected with micro bumps MCB placed between memory dies.

Figure 21:
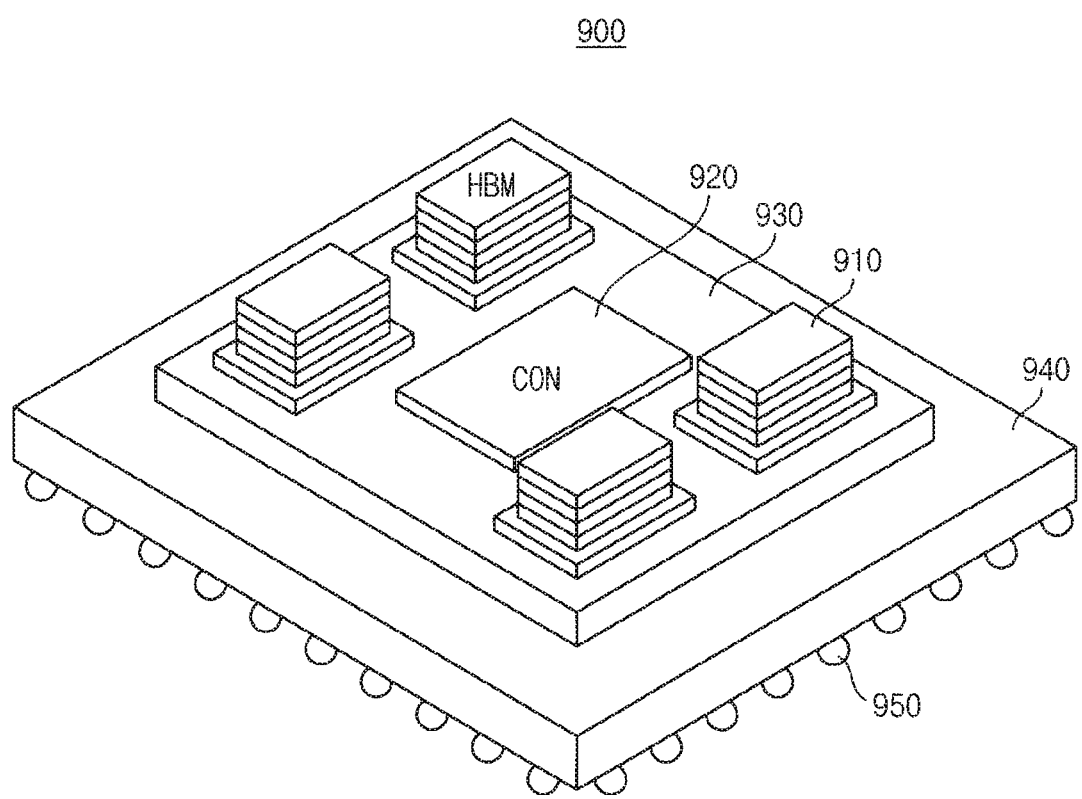
FIG. 21 is a diagram illustrating a semiconductor package including the stacked memory device, according to exemplary embodiments of the present disclosure.

FIG. 21 is a diagram illustrating a semiconductor package including the stacked memory device, according to exemplary embodiments of the present disclosure. Referring to FIG. 21, a semiconductor package 900 may include one or more stacked memory devices 910 and a memory controller 920. The stacked memory devices 910 and the memory controller 920 may be mounted on an interposer 930, and the interposer on which the stacked memory devices 910 and the memory controller 920 are mounted may be mounted on a package substrate 940. The memory controller 920 may employ the memory controller 100 in FIG. 1. Each of the stacked memory devices 910 may be implemented in various forms and may be a memory device in a high bandwidth memory (HBM) form in which a plurality of layers are stacked. Accordingly, each of the stacked memory devices 910 may include a buffer die and a plurality of memory dies. The buffer die may include an error correction circuit and each of the memory dies may include a memory cell array.

The error correction circuit may perform an ECC encoding and an ECC decoding by using a first ECC. The first ECC may include a plurality of column vectors to gather multiple odd error bits and a mis-corrected bit due to the multiple odd error bits in one symbol when a read main data includes the multiple odd error bits.

The plurality of stacked memory devices 910 may be mounted on the interposer 930, and the memory controller 920 may communicate with the plurality of stacked memory devices 910. For example, each of the stacked memory devices 910 and the memory controller 920 may include a physical region, and communication may be performed between the stacked memory devices 910 and the memory controller 920 through the physical regions. Meanwhile, when each of the stacked memory devices 910 includes a direct access region, a test signal may be provided to each of the stacked memory devices 910 through conductive means (e.g., solder balls 950) mounted under package substrate 940 and the direct access region.

As mentioned above, according to exemplary embodiments, the ECC includes a plurality of column vectors corresponding to data bits, the column vectors are divided into a plurality of code groups corresponding to sun data units of a main data and the column vectors have elements to gather multiple odd error bits and a mis-corrected bit due to the multiple odd error bits in one symbol when the main data includes the multiple odd error bits. The one symbol includes one or two adjacent sub data units.

Therefore, although the main data includes multiple error bits which the error correction circuit cannot correct and/or detect, the error correction circuit in the memory controller may correct the multiple error bits and the mis-corrected bit in a sub data unit, because the multiple error bits and the mis-corrected bit are gathered in the sub data unit.

Exemplary embodiments of the present disclosure may be applied to semiconductor memory devices and memory systems employing the ECC described herein. While the present disclosure has been particularly shown and described with reference to the exemplary embodiments thereof, it will be understood by those of ordinary skill in the art that various changes in form and detail may be made therein without departing from the spirit and scope of the present disclosure as defined by the following claims.

What is claimed is:

1. An error correction circuit, comprising:
an error correction code (ECC) memory configured to store an ECC represented by a generation matrix including a plurality of common sub matrices and a plurality of individual sub matrices; and
an ECC engine configured to generate parity data from main data using the ECC, and to use the parity data to detect and/or correct at least one error bit in the main data; wherein the main data includes a plurality of data bits divided into a plurality of sub data units;
wherein the ECC includes a plurality of column vectors divided into a plurality of code groups corresponding to respective ones of the sub data units;
wherein the column vectors have elements configured to gather a mis-corrected bit and multiple error bits in one symbol;
wherein the column vectors associated with each of the plurality of code groups include: (i) ECC data within a corresponding common sub matrix that is equivalent for each of the plurality of code groups, and (ii) ECC data within a corresponding individual sub matrix that is unique to each of the plurality of code groups; and
wherein the mis-corrected bit is generated when the multiple error bits are present in the main data.

2. The error correction circuit of claim 1, wherein the one symbol includes one of the sub data units or two adjacent sub data units of the sub data units; wherein the multiple error bits include odd error bits; and wherein the column vectors have elements configured to place the mis-corrected bit in a sub data unit including the multiple error bits.

3. The error correction circuit of claim 1, wherein the multiple error bits include a first error bit, a second error bit and a third error bit; wherein when a first sub data unit of the sub data units includes the first error bit, the second error bit and the third error bit, a first code group corresponding to the first sub data unit includes a plurality of first column vectors; and wherein the plurality of first column vectors are configured such that a result of a bit-wise exclusive OR operation on three different column vectors of the first column vectors matches one of the column vectors of the first column vectors except the three different column vectors.

4. The error correction circuit of claim 1,
wherein the multiple error bits include a first error bit, a second error bit and a third error bit;
wherein when a first sub data unit and a second sub data unit of the sub data units includes the first error bit, the second error bit and the third error bit, a first code group of the plurality of code groups, corresponding to the first sub data unit, includes a plurality of second column vectors, and a second code group of the plurality of code groups, corresponding to the second sub data unit, includes a plurality of second column vectors; and
wherein the plurality of first column vectors and the plurality of second column vectors are configured such that a result of a bit-wise exclusive OR operation on three different column vectors of the first column vectors and the second column vectors matches one of column vectors of the first column vectors and the second column vectors except the three different column vectors.

5. The error correction circuit of claim 1, wherein the main data includes 2p-bits of the data bits, wherein p is an integer equal to or greater than six; wherein the parity data includes (p+2)-bit parity bits; wherein the ECC is a single error correction and double error detection (SECDED) code; wherein the sub data units include first through eighth sub data units, and each of the first through eighth sub data units includes (p+2) bits; and wherein the code groups include first through eighth code groups corresponding to the first through eighth sub data units, respectively.

6. The error correction circuit of claim 5, wherein each of the first through eighth code groups includes first through (p+2)-th column vectors; and wherein each of the first through (p+2)-th column vectors includes (p+2) elements.

7. The error correction circuit of claim 1, wherein the main data includes 3*2q-bit of the data bits, wherein q is an integer equal to or greater than six; wherein the parity data includes (q+3)-bit parity bits; wherein the ECC is a single error correction and double error detection (SECDED) code; wherein the sub data units include first through twelfth sub data units, and each of the first through twelfth sub data units includes (q+3) bits; and wherein the plurality of code groups include first through twelfth code groups corresponding to the first through twelfth sub data units, respectively.

8. The error correction circuit of claim 7, wherein each of the first through twelfth code groups includes first through (q+3)-th column vectors; and wherein each of the first through (q+3)-th column vectors includes (9+3) elements.

9. The error correction circuit of claim 1, wherein the ECC engine comprises:
an ECC encoder configured to perform an ECC encoding operation on the main data using the ECC to generate the parity data during a memory write operation; and
an ECC decoder configured to perform an ECC decoding operation on the main data based on the parity data using the ECC during a memory read operation.

10. The error correction circuit of claim 9, wherein the ECC decoder comprises:
a check bit generator configured to generate check bits based on the main data using the ECC;
a syndrome generator configured to generate syndrome data based on a comparison of the check bits and the parity data; and
a data corrector configured to correct the at least one error bit in the main data.

11. A semiconductor memory device, comprising:
a memory cell array including a plurality of bank arrays that respectively comprise a normal cell region, which stores main data, and a redundancy cell region, which stores first parity data associated with the corresponding main data;
an error correction circuit configured to generate the parity data based on the main data using an error correction code (ECC), and to correct at least one error bit in the main data using the parity data, wherein the ECC is represented by a generation matrix including a plurality of common sub matrices and a plurality of individual sub matrices; and
a control logic circuit configured to control the error correction circuit based on a command and an address;
wherein the main data includes a plurality of data bits divided into a plurality of sub data units;
wherein the ECC includes a plurality of column vectors divided into a plurality of code groups corresponding to the sub data units;
wherein the column vectors associated with each of the plurality of code groups include: (i) ECC data within a corresponding common sub matrix that is equivalent for each of the plurality of code groups, and (ii) ECC data within a corresponding individual sub matrix that is unique to each of the plurality of code groups; and
wherein the column vectors have elements configured to gather a mis-corrected bit and multiple error bits in one symbol, wherein the mis-corrected bit is generated due to the multiple error bits in the main data.

12. The semiconductor memory device of claim 11, wherein:
the one symbol includes one of the sub data units or two adjacent sub data units of the sub data units;
the multiple error bits include odd error bits; and
the column vectors have elements configured to place the mis-corrected bit in a sub data unit including the multiple error bits.

13. The semiconductor memory device of claim 11, wherein the multiple error bits include a first error bit, a second error bit and a third error bit; wherein when a first sub data unit of the sub data units includes the first error bit, the second error bit and the third error bit, a first code group corresponding to the first sub data unit includes a plurality of first column vectors; and wherein the plurality of first column vectors are configured such that a result of a bit-wise exclusive OR operation on three different column vectors of the first column vectors matches one of the column vectors of the first column vectors except the three different column vectors.

14. The semiconductor memory device of claim 11, wherein the main data includes 2p-bit of the data bits, wherein p is an integer equal to or greater than six; wherein the parity data includes (p+2)-bit parity bits; wherein the ECC is a single error correction and double error detection (SECDED) code; wherein the sub data units include first through eighth sub data units, and each of the first through eighth sub data units includes (p+2) bits; and wherein the code groups include first through eighth code groups corresponding to the first through eighth sub data units, respectively.

15. The semiconductor memory device of claim 11, comprising:
at least one buffer die; and
a plurality of memory dies, the plurality of memory dies being stacked on the at least one buffer die and conveying data through a plurality of through silicon via (TSV) lines;
wherein each of the plurality of memory dies includes the memory cell array, and
wherein the at least one buffer die includes the error correction circuit.

16. A memory system, comprising:
a semiconductor memory device; and
a memory controller configured to control the semiconductor memory device;
wherein the semiconductor memory device includes:
a memory cell array including a plurality of bank arrays, wherein each of the plurality of bank arrays includes a normal cell region that stores main data, and a redundancy cell region that stores first parity data associated with the main data, and wherein each of the plurality of bank arrays includes a plurality of dynamic memory cells coupled to word-lines and bit-lines;
an error correction circuit configured to generate the parity data based on the main data using a first error correction code (ECC), and to correct at least one error bit in the main data using the parity data, wherein the first ECC is represented by a generation matrix including a plurality of common sub matrices and a plurality of individual sub matrices; and
a control logic circuit configured to control the error correction circuit based on a command and an address provided from the memory controller;
wherein the main data includes a plurality of data bits divided into a plurality of sub data units;
wherein the first ECC includes a plurality of column vectors divided into a plurality of code groups corresponding to the sub data units,
wherein the column vectors associated with each of the plurality of code groups include: (i) ECC data within a corresponding common sub matrix that is equivalent for each of the plurality of code groups, and (ii) ECC data within a corresponding individual sub matrix that is unique to each of the plurality of code groups; and
wherein the column vectors have elements configured to gather a mis-corrected bit and multiple error bits in one symbol, wherein the mis-corrected bit is generated due to the multiple error bits in the main data.

17. The memory system of claim 16, wherein:
the one symbol includes one of the sub data units or two adjacent sub data units of the sub data units;
the multiple error bits include odd error bits;
the column vectors have elements configured to place the mis-corrected bit in a sub data unit including the multiple error bits; and
the first ECC is a single error correction and double error detection (SECDED) code.

18. The memory system of claim 16,
wherein the memory controller includes a second error correction circuit;
wherein the second error correction circuit includes:
a parity generator configured to generate a system parity data based on the main data to be transmitted to the semiconductor memory device using a second ECC;
a buffer configured to store the system parity data; and
an ECC decoder configured to generate check bits based on a read main data received from the semiconductor memory device using the second ECC, and configured to correct multiple error bits in the read main data based on comparison of the check bits and the system parity data.

19. The memory system of claim 18, wherein the second ECC is a code that corrects the multiple error bits in the read main data by symbol basis.

20. The memory system of claim 19, wherein:
the ECC decoder is configured to assign one or two of a plurality sub data units in the read main data as one symbol, and is further configured to correct the multiple error bits in the one symbol.

\* \* \* \* \*